(12) United States Patent
Kawabata et al.

(10) Patent No.: US 10,483,311 B2
(45) Date of Patent: Nov. 19, 2019

(54) SOLID-STATE IMAGE PICKUP DEVICE, MANUFACTURING METHOD OF SOLID-STATE IMAGE PICKUP DEVICE, AND IMAGE PICKUP DEVICE

(71) Applicant: CANON KABUSHIKI KAISHA, Tokyo (JP)

(72) Inventors: Kazunari Kawabata, Mitaka (JP); Hajime Ikeda, Yokohama (JP); Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/036,183

(22) Filed: Jul. 16, 2018

(65) Prior Publication Data

US 2019/0035827 A1 Jan. 31, 2019

(30) Foreign Application Priority Data

Jul. 27, 2017 (JP) .................................. 2017-145586

(51) Int. Cl.
*H04N 5/232* (2006.01)
*H01L 27/146* (2006.01)
*H04N 5/369* (2011.01)

(52) U.S. Cl.
CPC ...... *H01L 27/1463* (2013.01); *H01L 27/1461* (2013.01); *H01L 27/14607* (2013.01); *H01L 27/14636* (2013.01); *H01L 27/14645* (2013.01); *H01L 27/14689* (2013.01); *H04N 5/232122* (2018.08); *H01L 27/14621* (2013.01); *H01L 27/14627* (2013.01); *H04N 5/3696* (2013.01)

(58) Field of Classification Search
CPC .......... H04N 5/23212; H04N 5/232122; H01L 27/14636; H01L 27/14601; H01L 27/1461; H01L 27/14645; H01L 27/14686
USPC ........ 348/294, 308, 297, 300, 301; 257/291, 257/292, 258, 390, 443; 250/208.1
See application file for complete search history.

(56) References Cited

U.S. PATENT DOCUMENTS

| 7,750,711 | B2* | 7/2010 | Harada | ................... H01L 29/94 257/369 |
| 2013/0087875 | A1* | 4/2013 | Kobayashi | ..................... 257/432 |
| 2013/0182158 | A1* | 7/2013 | Kobayashi | .............. H01L 31/02 348/294 |

(Continued)

FOREIGN PATENT DOCUMENTS

| JP | 2014-204043 A | 10/2014 |
| JP | 2015-162658 A | 9/2015 |
| JP | 2017-084930 A | 5/2017 |

*Primary Examiner* — Marly S Camargo
(74) *Attorney, Agent, or Firm* — Canon U.S.A., Inc. IP Division

(57) ABSTRACT

The disclosure is related to a solid-state image pickup device in which an impurity concentration has a first peak including a local minimum value in a depth direction of a semiconductor substrate in an isolation region arranged between adjacent photoelectric conversion portions, the impurity concentration has a second peak including a local maximum value in the depth direction in a charge accumulation region of the adjacent photoelectric conversion portions, and a region that indicates the first peak and a region that indicates the second peak have a portion overlapped in a direction perpendicular to the depth direction.

23 Claims, 16 Drawing Sheets

(56) References Cited

U.S. PATENT DOCUMENTS

2014/0299746 A1* 10/2014 Iwata .................. H01L 27/1463
                                                            250/214.1
2017/0062500 A1    3/2017 Kimura
2017/0345853 A1* 11/2017 Kato ............................ 348/302

* cited by examiner

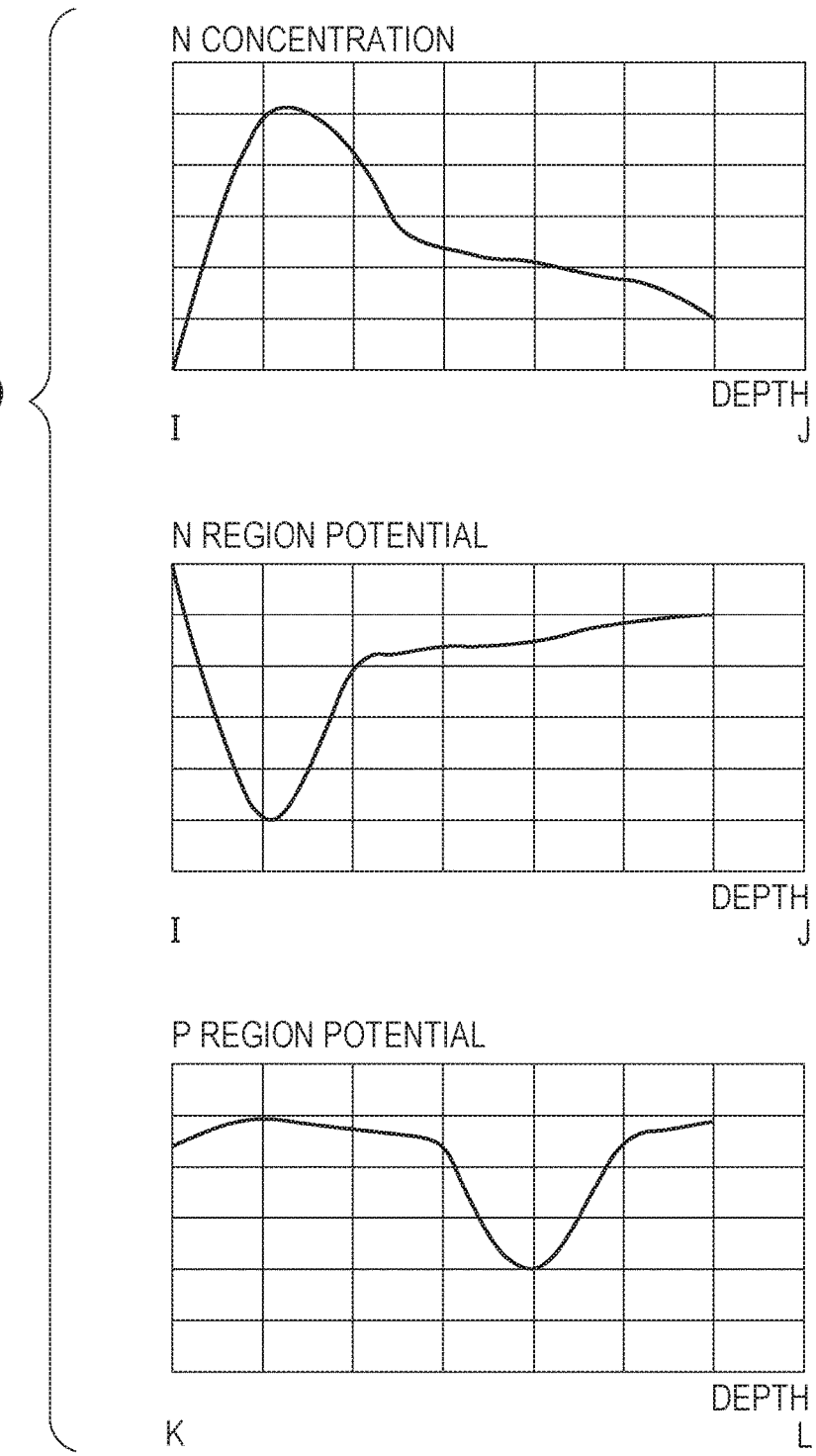

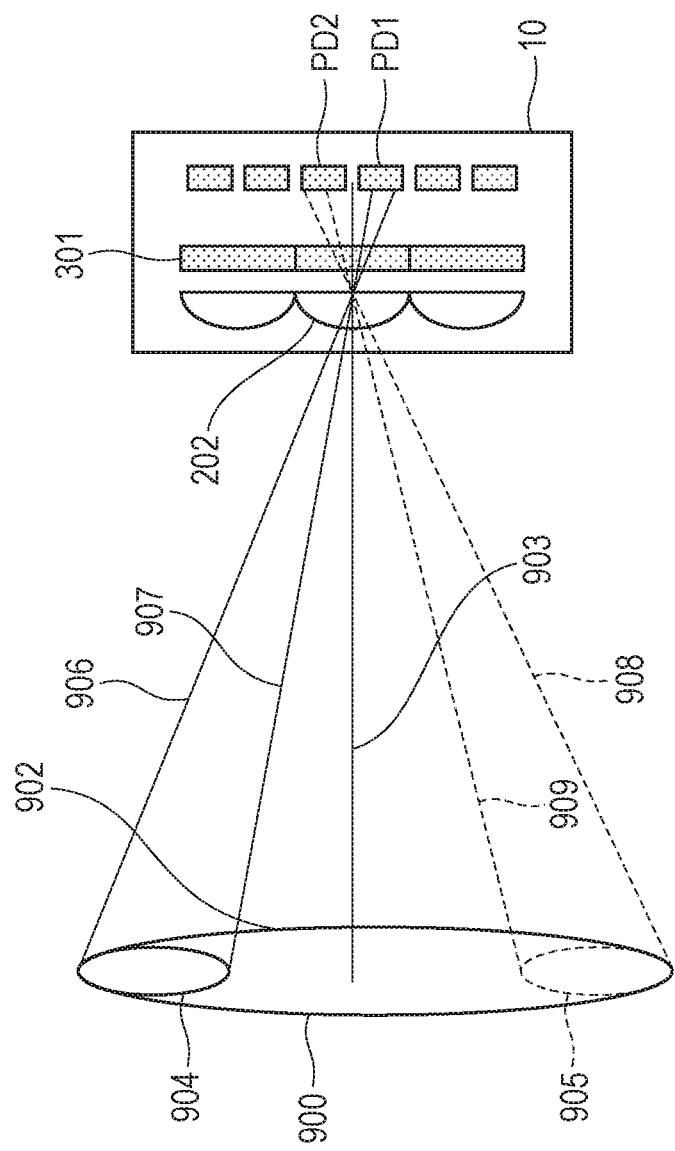

SOLID-STATE IMAGE PICKUP DEVICE, MANUFACTURING METHOD OF SOLID-STATE IMAGE PICKUP DEVICE, AND IMAGE PICKUP DEVICE

BACKGROUND OF THE INVENTION

Field of the Invention

The aspect of the embodiments relates to a solid-state image pickup device, a manufacturing method of a solid-state image pickup device, and an image pickup device.

Description of the Related Art

Japanese Patent Laid-Open No. 2014-204043 discloses a structure that obtains a desired signal by making an appropriate isolation structure between photoelectric conversion portions by arranging a plurality of photoelectric conversion portions in a pixel of a solid-state image pickup device and causing the concentration in an impurity region arranged between the photoelectric conversion portions to have a distribution. In the solid-state image pickup device described in Japanese Patent Laid-Open No. 2014-204043, an isolation performance of a signal between a plurality of photoelectric conversion portions may be insufficient depending on the wavelength of light.

SUMMARY OF THE INVENTION

A solid-state image pickup device has a semiconductor substrate including a first photoelectric conversion portion having a first semiconductor region of a first conductivity type that collects signal charges, a second photoelectric conversion portion having a second semiconductor region of the first conductivity type that collects signal charges, and a third semiconductor region of a second conductivity type different from the first conductivity type.

The third semiconductor region is arranged between the first semiconductor region and the second semiconductor region in plan view with respect to a first surface of the semiconductor substrate. An impurity concentration of the third semiconductor region has a local minimum value and an impurity concentration of the first semiconductor region has a local maximum value in a depth direction from the first surface to a second surface opposite to the first surface, and a depth range from a position X μm shallower than a position indicating the local minimum value to a position X μm deeper than the position indicating the local minimum value and a depth range from a position X μm shallower than a position indicating the local maximum value to a position X μm deeper than the position indicating the local maximum value are overlapped with each other, wherein X is a positive real number.

BRIEF DESCRIPTION OF THE DRAWINGS

FIGS. 5A to 5D are diagrams schematically showing a cross-section, an impurity density, and potential with respect to signal charges of a part of a solid-state image pickup device of a comparative example.

FIG. 11 is a diagram schematically showing a focusing relationship of an object.

DESCRIPTION OF THE EMBODIMENTS

Figure 1:
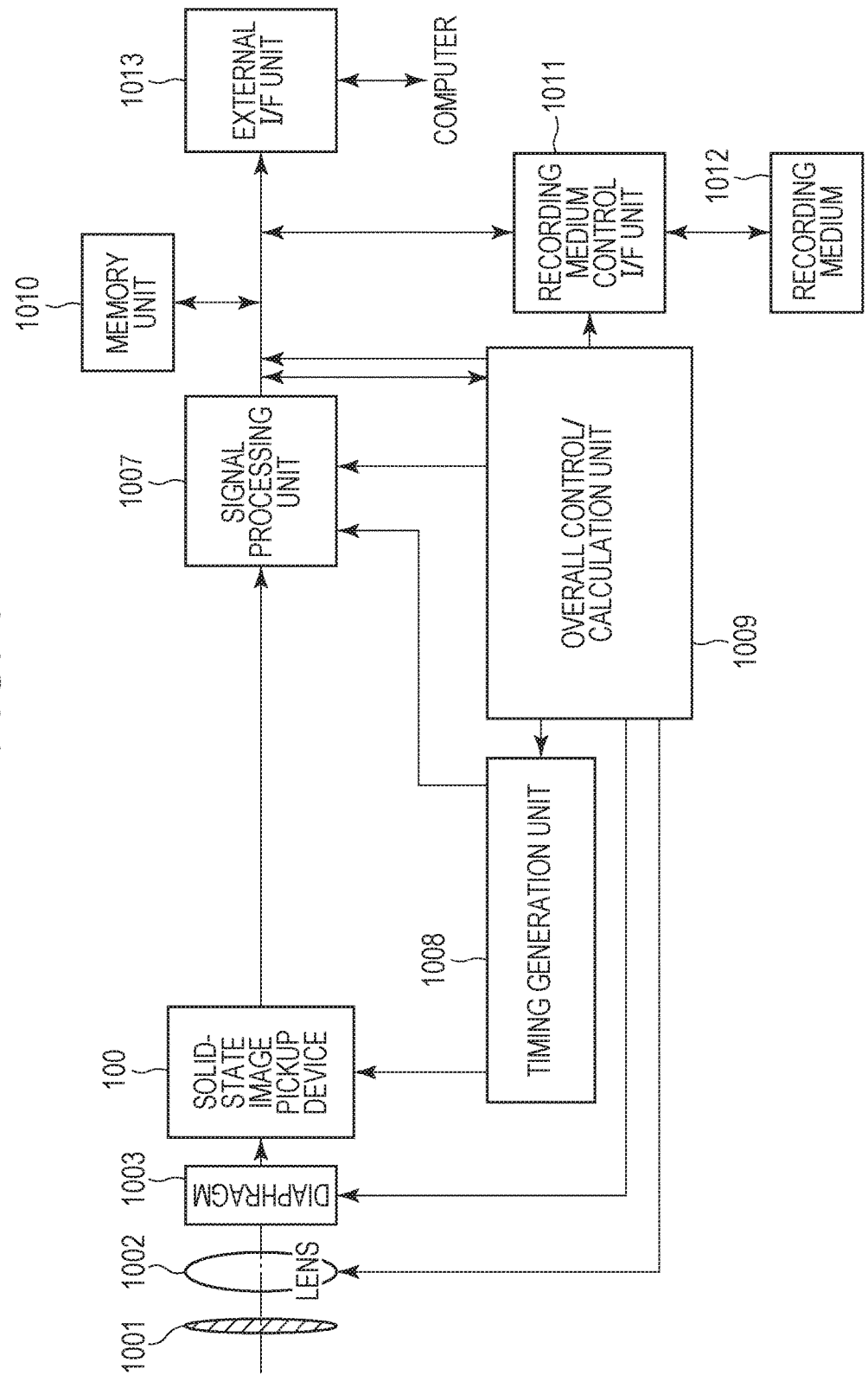
FIG. 1 is a block diagram schematically showing an image pickup device.

Hereinafter, embodiments will be described with reference to the drawings. The embodiments of the disclosure are not limited to only the embodiment described below. For example, some components of one of the embodiments below may be added to another embodiment, or some components of another embodiment may be replaced.

Each diagram is drawn to explain a configuration, and dimensions of each member shown in the diagrams may be different from dimensions of an actual component. In each diagram, the same reference numerals are given to the same members or the same components, and redundant description will be omitted.

In the description of the embodiments, a description that a position or a depth of a region is between A and B includes a case where the position or the depth of the region is A or B. Similarly, a description that a range of a position or a depth is a range from C to D includes a case where the position or the depth is C or D.

In the present specification, a peak including a local maximum value of an impurity concentration or potential in a depth direction indicates a convex portion in a positive direction of Y axis of a graph when an X axis is a depth direction and a Y axis perpendicular to the X direction is the impurity concentration or the potential. Similarly, a peak including a local minimum value of the impurity concentration or the potential in the depth direction indicates a convex portion in a negative direction of the Y axis of the graph when the X axis is the depth direction and the Y axis perpendicular to the X direction is the impurity concentration or the potential.

Specifically, the peak including the local maximum value of the impurity concentration or the potential in the depth direction indicates a portion between positions indicating inflection points (including positions corresponding to the inflection points) on both sides of the local maximum value in the depth direction in the graph (on the X axis in the graph). When there is no inflection point on both sides or one side of the local maximum value in the depth direction in an object range, a boundary position on the side where there is no inflection point in the range is defined as an end of the peak.

Similarly, the peak including the local minimum value of the impurity concentration or the potential in the depth direction indicates a portion between positions indicating inflection points (including positions corresponding to the inflection points) on both sides of the local minimum value in the depth direction in the graph (on the X axis in the graph). When there is no inflection point on both sides or one side of the local minimum value in the depth direction in an object range, a boundary position on the side where there is no inflection point in the range is defined as an end of the peak in the same manner as described above.

First Embodiment

For example, a solid-state image pickup device shown in the present embodiment can be used for an image pickup device as shown in FIG. 1. The mage pickup device will be described here by using a camera as an example. In the image pickup device, light emitted from an object 1001 passes through a lens 1002 and a diaphragm 1003 and reaches a solid-state image pickup device 100. The light is converted into an electric signal by the solid-state image pickup device 100 and inputted into a signal processing unit 1007. The image pickup device further includes a memory unit 1010 for temporarily storing image data and an external interface unit 1013 for communicating with an external computer and the like.

Further, the image pickup device includes a recording medium 1012 such as a semiconductor memory for recording/reading image data and a recording medium control interface unit (recording medium control I/F unit) 1011 for performing recording/reading on the recording medium 1012. The recording medium 1012 may be built in the image pickup device or may be detachably mounted on the image pickup device.

Further, the image pickup device includes an overall control/calculation unit 1009 that performs various calculations and controls the entire image pickup device and a timing generation unit 1008 that outputs various timing signals to the signal processing unit 1007.

Figure 2:
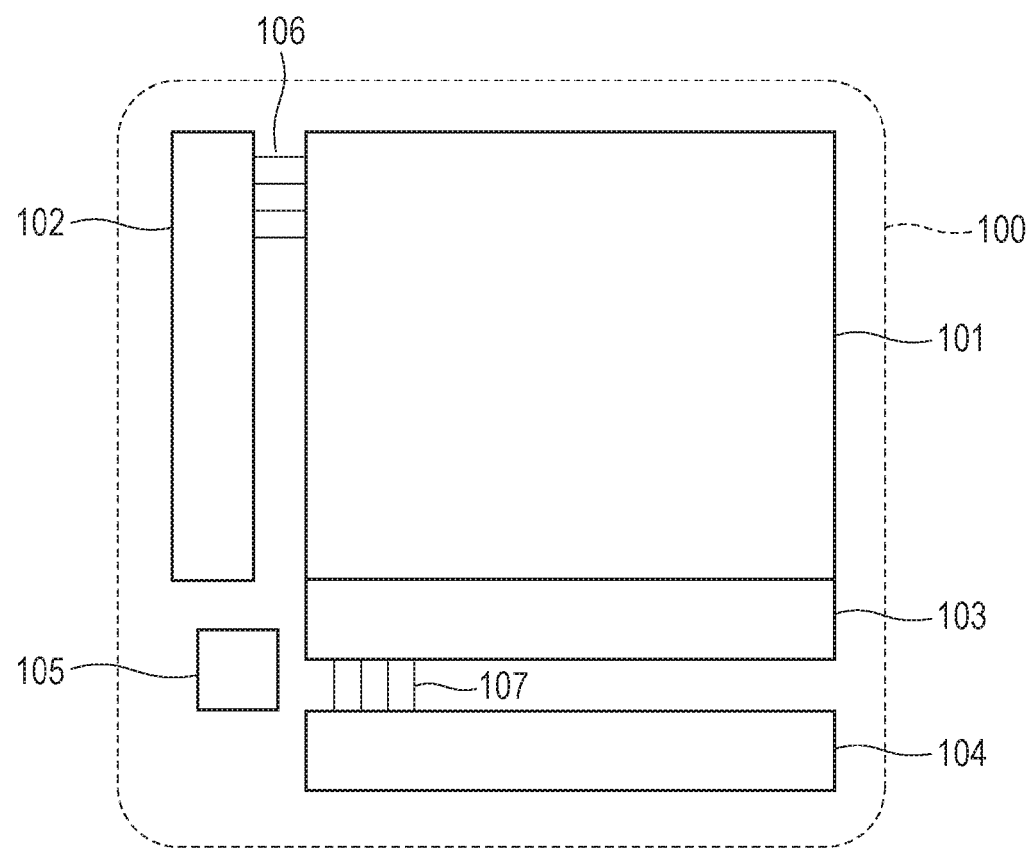
FIG. 2 is a block diagram schematically showing a solid-state image pickup device.

FIG. 2 is a diagram showing an overview of the solid-state image pickup device according to the present embodiment. In FIG. 2, the solid-state image pickup device 100 includes a pixel array 101, a vertical selection circuit 102, a column circuit 103, a horizontal selection circuit 104, and a serial interface 105.

The pixel array 101 has a plurality of pixels and, for example, the plurality of pixels are arranged in a matrix. Each of the plurality of pixels has a photoelectric conversion unit. The photoelectric conversion unit may have a plurality of photoelectric conversion portions.

The vertical selection circuit 102 selects a predetermined row in the pixel array 101 through a scanning wire 106 and a signal is outputted from a photoelectric conversion portion included in the selected row to a vertical output line 107. The vertical output line 107 can be provided for each column or for each plurality of columns, or a plurality of vertical output lines 107 can be provided to one column.

A signal read to the vertical output line 107 is inputted into the column circuit 103. The column circuit 103 can perform processing such as amplification, digital-analog conversion, noise removal, and the like of the signal. The horizontal selection circuit 104 sequentially selects signals held by the column circuit 103 and outputs the signals to a horizontal output line not shown in the drawings. The serial interface 105 communicates with outside for, for example, determining an operation mode from the outside.

The solid-state image pickup device 100 may include, for example, a timing generator that provides a timing signal to the vertical selection circuit 102, the horizontal selection circuit 104, and the column circuit 103, a control circuit, or the like in addition to the components shown in FIG. 2. The timing generation unit 1008 in FIG. 1 may double as the timing generator. The overall control/calculation unit 1009 in FIG. 1 may double as the control circuit.

The block diagram of FIG. 2 can be applied to all the embodiments described in the present specification. The vertical and the horizontal are words defined for convenience and can be switched to each other.

A configuration of the solid-state image pickup device 100 of the present embodiment will be described with reference to FIGS. 4A to 6B.

Figure 3:
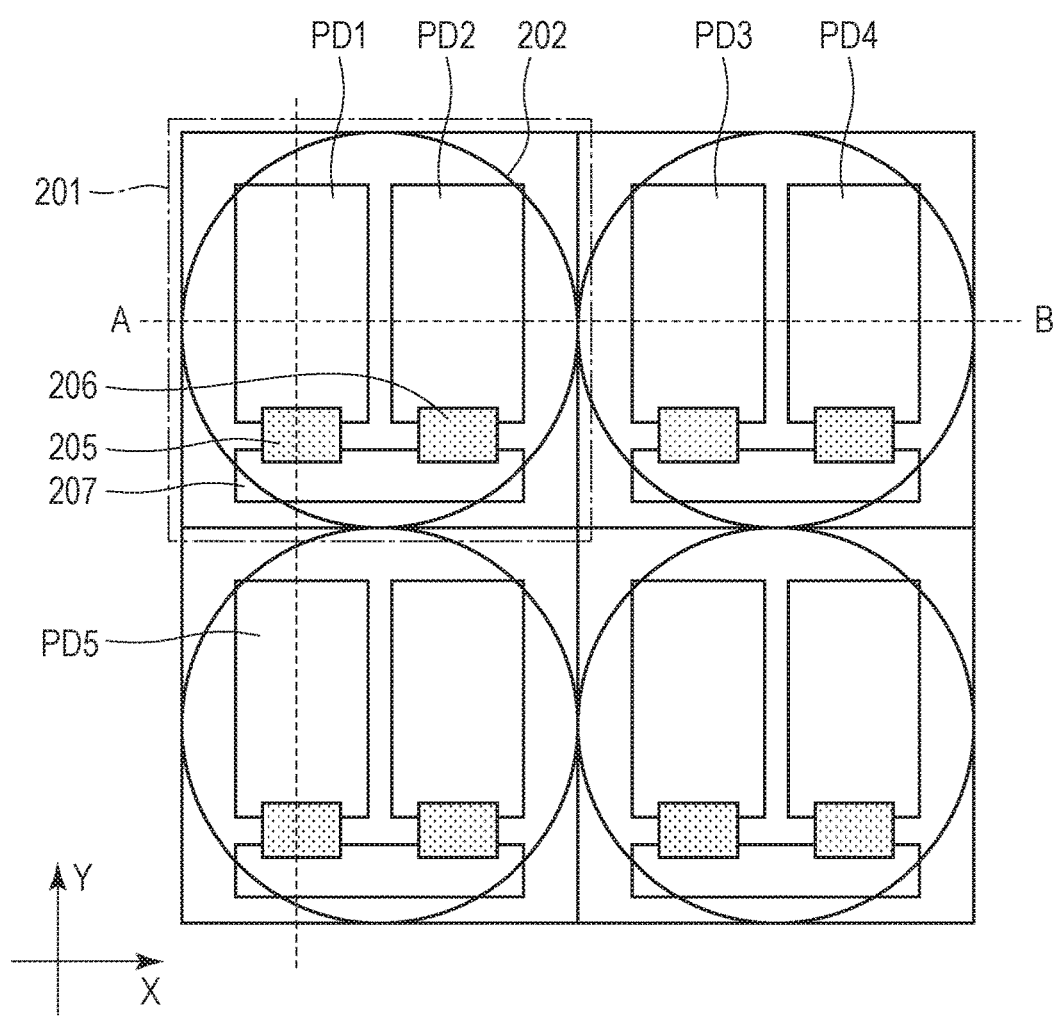
FIG. 3 is a diagram schematically showing a top view of a part of the solid-state image pickup device.

FIGS. 4A to 4G show a schematic diagram of an upper surface of some of a plurality of pixels of the solid-state image pickup device 100. FIG. 3 shows four photoelectric conversion units 201 arranged in two rows and two columns. Photoelectric conversion portions included in one photoelectric conversion unit 201 receive light from one microlens 202. One photoelectric conversion unit 201 includes a plurality of photoelectric conversion portions PD. FIGS. 4A to 4F show an example in which one photoelectric conversion unit 201 includes two photoelectric conversion portions, such as, for example, a photoelectric conversion portion PD1 and a photoelectric conversion portion PD2.

The solid-state image pickup device 100 is not limited to a configuration where one photoelectric conversion unit 201 includes two photoelectric conversion portions but may have a configuration where one photoelectric conversion unit 201 includes, for example, four photoelectric conversion portions or nine photoelectric conversion portions.

A transfer gate 205 and a transfer gate 206 which are gates of transfer transistors transfer signal charges generated in the photoelectric conversion portion PD1 and the photoelectric conversion portion PD2, respectively, to a floating diffusion portion 207. The floating diffusion portion 207 may be shared by the plurality of photoelectric conversion portions PD1 and PD2.

The solid-state image pickup device of the present embodiment will be described with reference to FIGS. 4A to 4F.

Figure 4A:
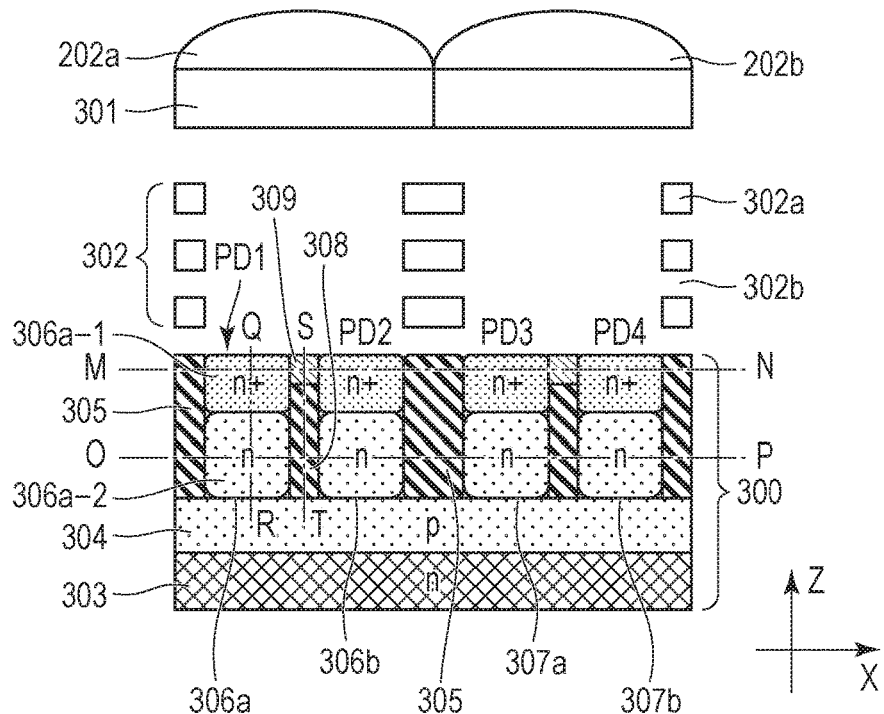
FIGS. 4A to 4G are diagrams schematically showing cross-sections, impurity densities, and potential with respect to signal charges of a part of the solid-state image pickup device.

FIG. 4A shows a section structure of two photoelectric conversion units of the present embodiment. A semiconductor substrate 300 has a plurality of photoelectric conversion portions PD1 to PD4 whose signal charges are electrons. Each of the photoelectric conversion portions PD1 and PD2 receives light that has passed through a microlens 202a. Each of the photoelectric conversion portions PD3 and PD4 receives light that has passed through a microlens 202b. Here, a case is shown where a microlens and a photoelectric conversion portion corresponding to the microlens overlap with each other in plan view. However, positions of the microlens and the photoelectric conversion portion may be shifted from each other in plan view according to a position of the pixel array 101.

Here, a case will be described where the signal charge is electrons. However, the solid-state image pickup device is not limited to this form, and the signal charge may be holes. When the signal charge is holes, a different (i.e. an opposite) conductivity type semiconductor region may be used for each semiconductor region.

In FIG. 4A, the semiconductor substrate 300 includes N-type (first conductivity type) semiconductor regions 303, 306a, 306b, 307a, and 307b, and P-type (second conductivity type) semiconductor regions 304, 305, 308, and 309. The P-type semiconductor region 304 and the plurality of N-type semiconductor regions 306a, 306b, 307a, and 307b form PN junctions, respectively. The P-type semiconductor region 304 is arranged on the semiconductor region 303, and, for example, an N-type semiconductor substrate can be used as the semiconductor region 303. Here, an example will be shown where an N-type semiconductor substrate is used as the semiconductor region 303. However, a P-type semiconductor substrate may be used as the semiconductor region 303.

The photoelectric conversion portions PD1 and PD2 have the N-type (first conductivity type) semiconductor region 306a and the N-type semiconductor region 306b, respectively. The photoelectric conversion portions PD3 and PD4 have the N-type (first conductivity type) semiconductor region 307a and the N-type semiconductor region 307b, respectively. Specifically, the photoelectric conversion portion PD1 is formed by the P-type semiconductor region 304 and the N-type semiconductor region 306a, and the photoelectric conversion portion PD2 is formed by the P-type semiconductor region 304 and the N-type semiconductor region 306b. Similarly, the photoelectric conversion portion PD3 is formed by the P-type semiconductor region 304 and the N-type semiconductor region 307a, and the photoelectric conversion portion PD4 is formed by the P-type semiconductor region 304 and the N-type semiconductor region 307b.

Figure 4B:
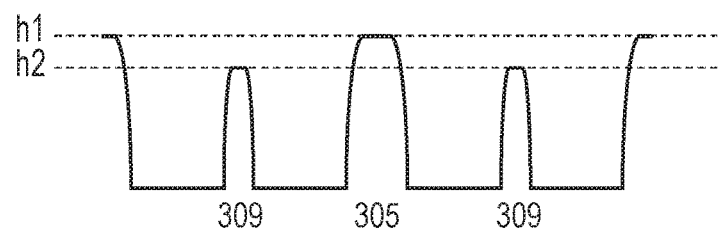
Figure 4C:
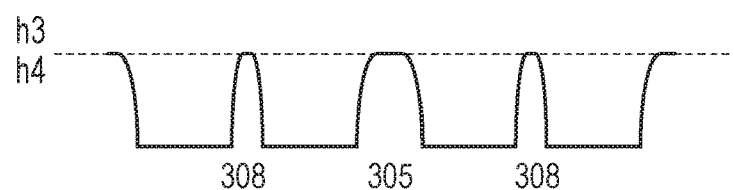

Potential of the N-type semiconductor regions 306a, 306b, 307a, and 307b is low with respect to electrons and these semiconductor regions are regions for collecting signal charges. Further, as shown in FIG. 4F, a P-type semiconductor region 311 may be arranged on incident surfaces of the N-type semiconductor regions 306a, 306b, 307a, and 307b to form a so-called buried type photodiode. The impurity concentration of the P-type semiconductor region 311 is higher than those of the semiconductor regions 304, 305, 308, and 309. Here, the impurity concentration of a certain region is a precise impurity concentration and indicates a so-called net impurity concentration.

A color filter 301 and a multilayer wiring layer 302 including a plurality of laminated wiring layers 302a and insulating layers 302b are arranged between the microlens 202 and the semiconductor substrate 300. Here, three wiring layers 302a arranged at different heights are shown.

In the present embodiment, an example is shown where each of the N-type semiconductor regions 306a, 306b, 307a, and 307b has two semiconductor regions arranged at different depths. Specifically, the semiconductor region 306a has a semiconductor region 306a-1 and a semiconductor region 306a-2 whose impurity concentration is lower than that of the semiconductor region 306a-1. The semiconductor region 306a-1 and the semiconductor region 306a-2 may be integrally formed as one semiconductor region or may be laminated in a depth direction by a plurality of manufacturing process conditions. Similarly, each of the semiconductor regions 306b, 307a, and 307b has two semiconductor regions whose impurity concentrations are different from each other.

The photoelectric conversion portions PD1 and PD2 receive light collected by the same microlens 202a and are included in a first photoelectric conversion unit. The photoelectric conversion portions PD1 and PD2 are adjacent to each other in one direction, that is, the X direction in FIG. 4A. The photoelectric conversion portions PD3 and PD4 receive light collected by the same microlens 202b and are included in a second photoelectric conversion unit. The photoelectric conversion portions PD3 and PD4 are adjacent to each other in one direction, that is, the X direction in FIG. 4A.

The P-type semiconductor region 308 and the P-type semiconductor region 309 are arranged between the N-type semiconductor region 306a included in the photoelectric conversion portion PD1 and the N-type semiconductor region 306b included in the photoelectric conversion portion PD2. The P-type semiconductor regions 308 and 309 function as a potential barrier against electrons between the N-type semiconductor regions 306a and 306b. A second photoelectric conversion unit also has the same configuration.

The photoelectric conversion portions PD2 and PD3 receive light collected by the different microlenses 202a and 202b, respectively. The photoelectric conversion portions PD2 and PD3 are arranged adjacent to each other in the X direction. The P-type semiconductor region 305 is arranged between the N-type semiconductor region 306b included in the photoelectric conversion portion PD2 and the N-type semiconductor region 307a included in the photoelectric conversion portion PD3. The P-type semiconductor region 305 functions as a potential barrier against electrons which are signal charges of the photoelectric conversion portions PD2 and PD3 between the N-type semiconductor region 306b and the N-type semiconductor region 307a.

FIG. 4A is a schematic diagram of a part of the solid-state image pickup device 100 in a cross-section including the semiconductor regions 306a, 306b, 308, and 309. In FIG. 4A, the semiconductor substrate 300 has a first surface on which the multilayer wiring layer 302, the microlens 202, and the like are arranged and a second surface opposite to the first surface. In FIG. 4A, a direction from the first surface to the second surface (−Z direction) is defined as a depth direction.

In the semiconductor region 306a in the cross-section shown in FIG. 4A, the semiconductor region 306a-2 whose impurity concentration is lower than that of the semiconductor region 306a-1 is arranged at a position deeper than the semiconductor region 306a-1. In the cross-section shown in FIG. 4A, the N-type semiconductor region 306a-2 and the P-type semiconductor region 304 form a PN junction. The impurity concentration of the semiconductor region 306a has a local maximum value in the depth direction, and a region indicating the local maximum value is included in the semiconductor region 306a-1. The local maximum value of the impurity concentration in the semiconductor region 306a-1 is a maximum value in a region from the first surface of the semiconductor substrate 300 to a deepest position of a PN junction formed by the semiconductor region 306a-2 and the semiconductor region 304.

In the P-type semiconductor regions 308 and 309 in the cross-section shown in FIG. 4A, the impurity concentration has a local minimum value in a region from the first surface to the PN junction formed by the semiconductor region 306a-2 and the semiconductor region 304 in the depth direction. The region where the impurity concentration indicates the minimum value is included in the semiconductor region 309. The local minimum value of the impurity concentration of the semiconductor region 309 is smaller than the local minimum value of the impurity concentration of the semiconductor region 308.

Figure 4D:
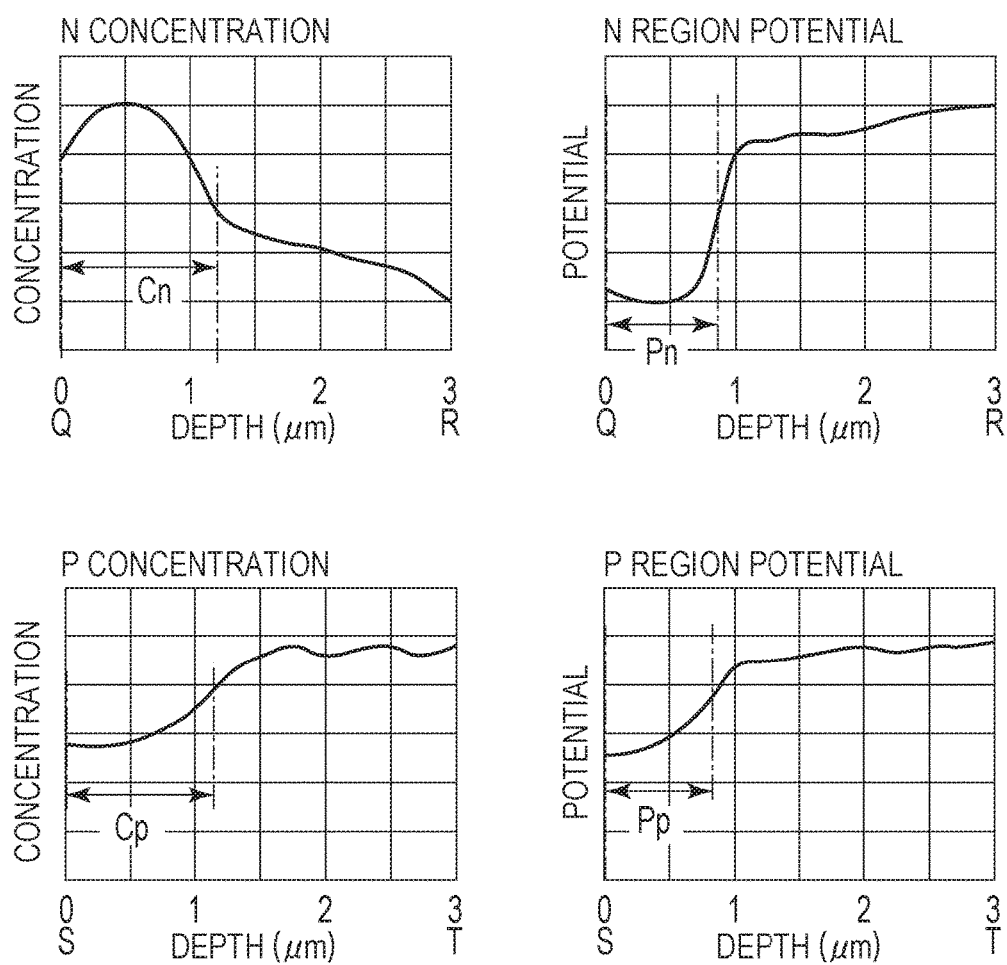
Figure 4E:
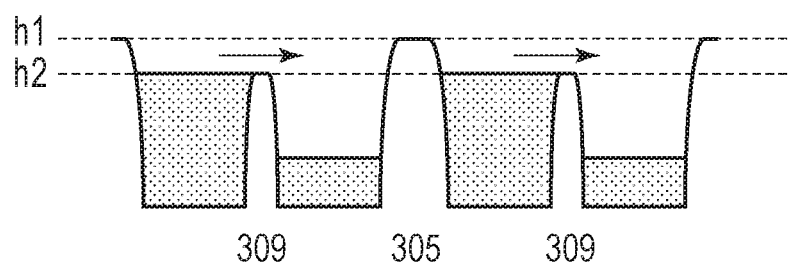
Figure 4F:
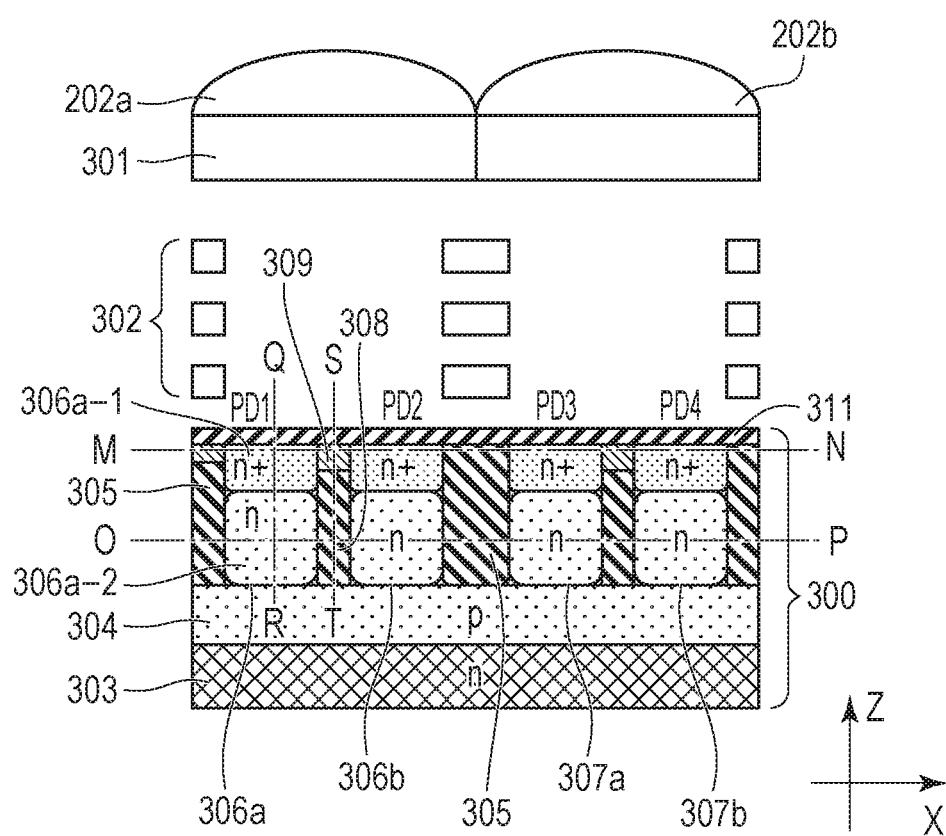
Figure 4G:
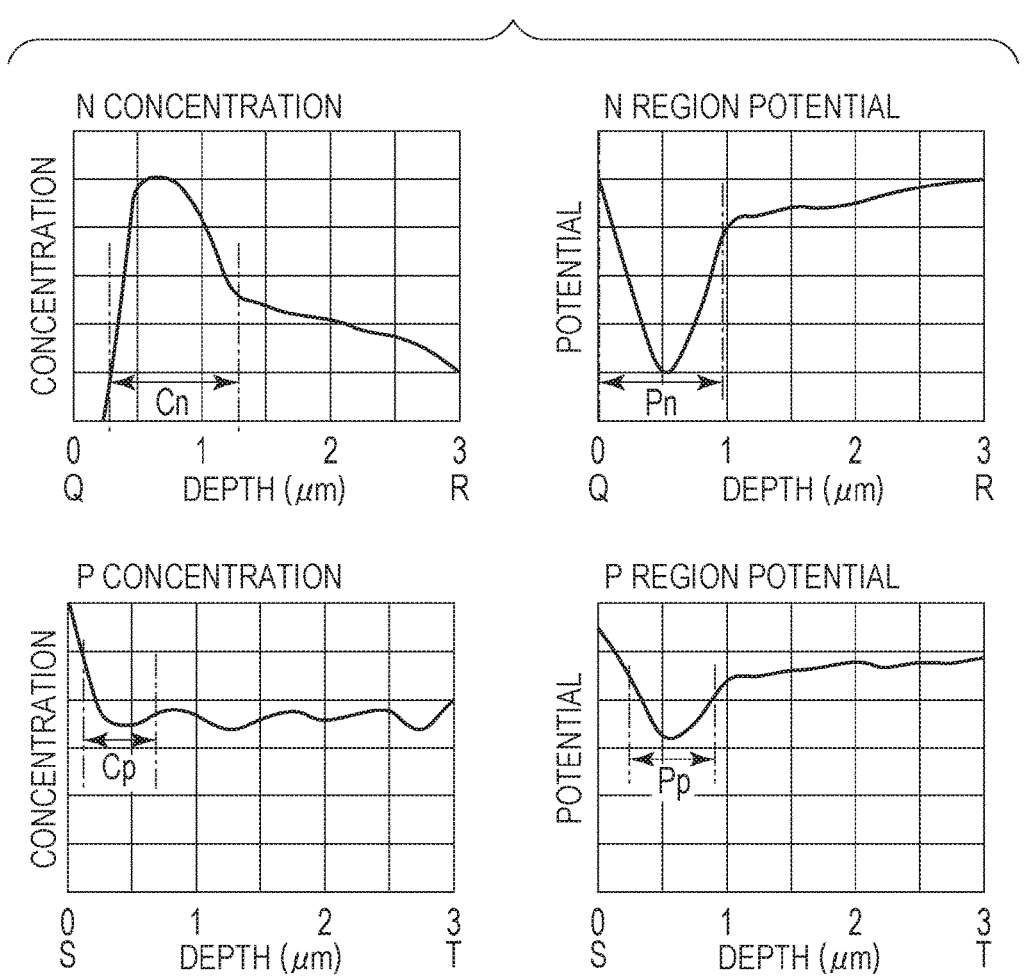

FIGS. 4D and 4G show the impurity concentration and the potential with respect to signal charges with respect to the depth direction in the cross-section of the solid-state image pickup device shown in FIGS. 4A and 4F, respectively.

A region Cn where the impurity concentration of the semiconductor region 306a-1 indicates a peak including a local maximum value and a region Cp where the impurity concentration of the semiconductor region 309 indicates a peak including a local maximum value have an overlapped portion in the X direction perpendicular to the depth direction.

Further, in the cross-section shown in FIG. 4A, the semiconductor region 306a-1 has a region Pn (where potential is low) where potential with respect to electrons, which are signal charges, reaches a peak having a local minimum value in the depth direction. The P-type semiconductor regions 308 and 309 have a region Pp where potential with respect to electrons, which are signal charges, reaches a peak including a local minimum value in the region from the first surface to the PN junction formed by the semiconductor region 306a-2 and the semiconductor region 304 in the depth direction. The region including the peak having the local minimum value is included in the semiconductor region 309. In the region from the first surface to the PN junction formed by the semiconductor region 306a-2 and the semiconductor region 304 in the depth direction, the local minimum value of the potential with respect to the signal charges of the semiconductor region 309 is smaller than the local minimum value of the potential with respect to the signal charges of the semiconductor region 308.

A region where potential with respect to signal charges indicates a peak including a local minimum value in the semiconductor region 306a-1 and a region where the impurity concentration of the semiconductor region 309 indicates a peak including a local maximum value have an overlapped portion in the X direction perpendicular to the depth direction.

Here, the semiconductor region 309 is arranged on a shallow side with respect to the semiconductor region 308 in the depth direction of the semiconductor substrate 300.

FIGS. 4B and 4C schematically show potential of a part of a cross-section of the solid-state image pickup device 100 taken along a line M-N and a line O-P in FIG. 4A. Further, FIGS. 4D and 4G respectively show the impurity concentrations along a line Q-R, the impurity concentrations along a line S-T, the potentials with respect to signal charges along the line Q-R, and the potentials with respect to signal charges along the line S-T in FIGS. 4A and 4F.

As shown in FIGS. 4D and 4G, in the solid-state image pickup device of the present embodiment, in the N-type semiconductor region 306a, there are a region that indicates a local maximum value of the impurity concentration and a region that indicates a local minimum value of the potential with respect to signal charges (electrons) in a relatively shallow position (on a first surface side). Further, in the P-type semiconductor region 309 located at a position (on the first surface side) shallower than the semiconductor region 308, there are a region that indicates a local minimum value of the impurity concentration and a region that indicates a local minimum value of the potential with respect to signal charges.

Therefore, the potentials along the line M-N and the potentials along the line O-P are as shown in FIGS. 4B and 4C. The line M-N passes through the semiconductor regions 306a-1 and 306b-1 and is located at a position where the impurity concentrations of the N-type semiconductor regions 306a and 306b are high and a potential depth with respect to signal charges is located at a deep position (depth). Along the line M-N, the P-type semiconductor region 309 is arranged between the semiconductor regions 306a-1 and 306b-1.

The line O-P passes through the N-type semiconductor regions 306a-2 and 306b-2 and is located at a position where the impurity concentrations of the N-type semiconductor regions 306a and 306b are relatively low and a potential depth with respect to signal charges is located at a shallow position (depth). Along the line O-P, the semiconductor region 308 whose impurity concentration is higher than that of the semiconductor region 309 is arranged between the semiconductor regions 306a-2 and 306b-2.

On the line M-N, the semiconductor region 309 is arranged between the photoelectric conversion portion PD1 and the photoelectric conversion portion PD2 which are arranged corresponding to one micro lens 202a. Further, the semiconductor region 305 is arranged between the photoelectric conversion portion PD2 and the photoelectric conversion portion PD3 which correspond to different microlenses 202a and 202b. As show in FIG. 4B, a potential h2 of the semiconductor region 309 with respect to signal charges is lower than a potential h1 of the semiconductor region 305 with respect to signal charges.

Signal charges generated by the photoelectric conversion portion PD1 and the photoelectric conversion portion PD2 are collected by the semiconductor regions 306a and 306b, respectively. FIG. 4E schematically shows a situation where, in the photoelectric conversion unit 201 of a part of the solid-state image pickup device 100 in FIGS. 4A and 4F, an incident amount of light into one photoelectric conversion portion (here, PD1 or PD3) is greater than that into the other photoelectric conversion portion (here, PD2 or PD4).

The potential h2 of the semiconductor region 309 with respect to signal charges is lower than the potential h1 of the semiconductor region 305 with respect to signal charges. Therefore, when signal charges generated by photoelectric conversion in the photoelectric conversion portion PD1 reach a saturation charge quantity and thereafter charges are generated in the photoelectric conversion portion PD1, the signal charges begin to leak to the photoelectric conversion portion PD2 corresponding to the same microlens 202a. In other words, when the signal charges reach the saturation charge quantity in one photoelectric conversion portion in the photoelectric conversion unit 201, the signal charges begin to leak to a photoelectric conversion portion in the same photoelectric conversion unit instead of a photoelectric conversion portion in a different photoelectric conversion unit.

By using the semiconductor region 309 as a leakage path of the signal charges, the signal charges generated in one photoelectric conversion unit can be detected more accurately than when the potentials with respect to the signal charges of the semiconductor regions 305 and 309 are the same.

Figure 5A:
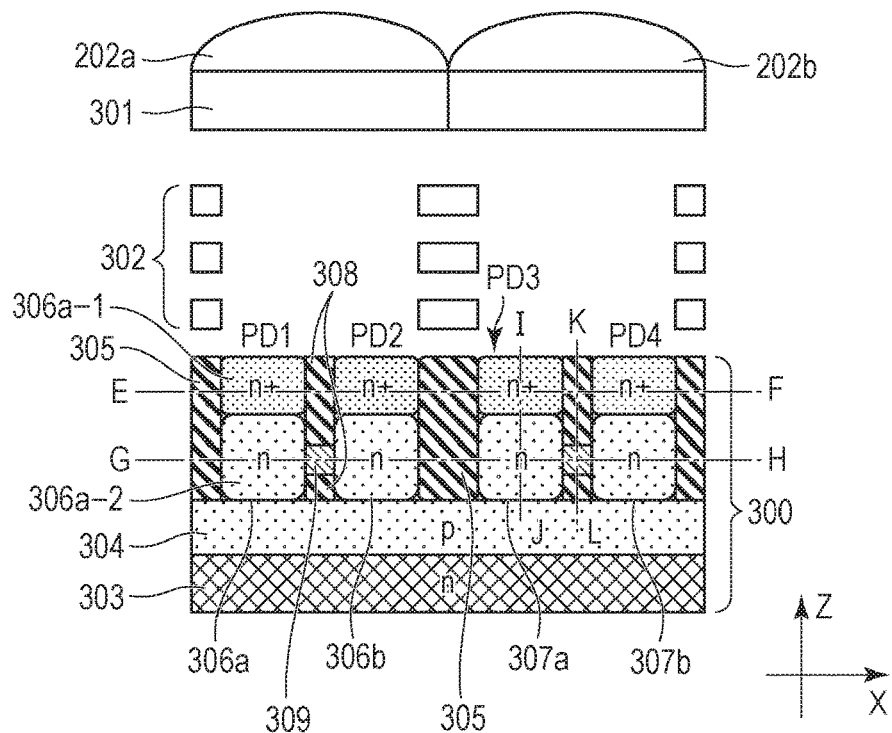

Next, an example of the effects of the solid-state image pickup device 100 according to the present embodiment will be described with reference to a comparative example. FIG. 5A shows a schematic diagram of a cross-section of a part of a solid-state image pickup device 100 as a comparative example. The same numbers are given to components having the same functions as those in FIGS. 4A to 4G.

Different points between the solid-state image pickup device 100 according to the comparative example and the solid-state image pickup device 100 according to the present embodiment will be described. As shown in FIG. 5A, a layout of the P-type semiconductor regions 308 and 309 of the solid-state image pickup device 100 according to the comparative example is different from that of the solid-state image pickup device 100 shown in FIG. 4A.

In FIG. 5A, the P-type semiconductor region 308 is arranged between the two N-type semiconductor regions 306a and 306b. Further, the semiconductor region 309 whose impurity concentration is lower than that of the semiconductor region 308 is arranged between the semiconductor regions 308 in the depth direction. The semiconductor region 308 may be in contact with the P-type semiconductor region 304. As shown in FIG. 4D, the impurity concentration and the potential in the N-type semiconductor regions 306a, 306b, 307a, and 307b are the same as those shown in FIG. 4A.

On the other hand, the impurity concentration and the potential distribution with respect to the signal charges in the P-type semiconductor regions 308 and 309 are different from those of the solid-state image pickup device 100 shown in FIG. 4A.

More specifically, in the configuration of FIG. 4A, in the P-type semiconductor regions 308 and 309, a region that indicates a local minimum value of the impurity concentration is formed on the first surface side of the semiconductor substrate 300. Therefore, in the P-type semiconductor regions 308 and 309, the minimum value of the potential with respect to signal charges is located on the first surface side of the semiconductor substrate 300.

In other words, a region to be a leakage path of the signal charges generated in the photoelectric conversion portion PD1 is arranged close to a region where the potential with respect to signal charges indicates a local minimum value in the photoelectric conversion portion PD1. For example, a region that indicates a peak including a local maximum value of the impurity concentration in the semiconductor region 306a in the depth direction and a region that indicates a peak including a local minimum value of the impurity concentration of the semiconductor regions 308 and 309 in the depth direction at least partially overlap with each other in a direction perpendicular to the depth direction.

The semiconductor region 306a has a region that indicates a peak including a local minimum value of the potential with respect to signal charges in the depth direction. The semiconductor regions 308 and 309 have a region that indicates a peak including a local minimum value of the potential with respect to signal charges in the depth direction. The two regions at least partially overlap with each other in a direction perpendicular to the depth direction.

On the other hand, in the configuration of the comparative example shown in FIG. 5A, in the P-type semiconductor regions 308 and 309, a peak including a local minimum value of the concentration of impurity which gives P-type is formed at a position deeper than the N-type semiconductor regions 306a-1 and 306b-1. Therefore, in the P-type semiconductor regions 308 and 309, a peak including the minimum value of the potential with respect to signal charges is formed at a position deeper than the N-type semiconductor regions 306a-1 and 306b-1.

In other words, a region to be a leakage path of the signal charges generated in the photoelectric conversion portion PD1 is separated from a region where the potential with respect to signal charges indicates a local minimum value in the photoelectric conversion portion PD1 and is arranged close to a region where the potential is high. For example, a region that indicates a peak including a local maximum value of the impurity concentration in the depth direction in the N-type semiconductor region 306a and a region that indicates a peak including a local minimum value of the impurity concentration in the depth direction in the P-type semiconductor regions 308 and 309 do not overlap with each other in a direction perpendicular to the depth direction. Further, a region that indicates a peak including a local minimum value of the potential with respect to signal charges in the depth direction in the N-type semiconductor region 306a and a region that indicates a peak including a local minimum value of the potential with respect to signal charges in the depth direction in the P-type semiconductor region 309 do not overlap with each other in a direction perpendicular to the depth direction.

Figure 5B:
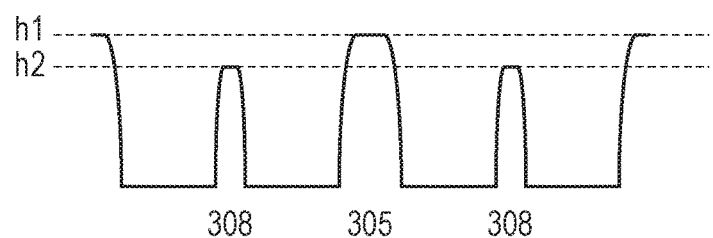
Figure 5C:
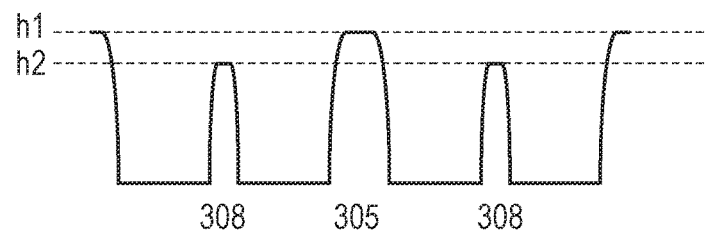

FIGS. 5B and 5C schematically show the potential of the solid-state image pickup device 100 according to the comparative example along a line E-F and along a line G-H. FIG. 5D shows, from the above, the concentration of impurity which gives N-type to a region along a line I-J in FIG. 5A, the potential with respect to signal charges along the line I-J, and the potential with respect to signal charges along the line K-L. As shown in FIG. 5D, in the comparative example, in the N-type semiconductor region 306a, there are a region that indicates a local minimum value of the impurity concentration and a region that indicates a local minimum value of the potential with respect to signal charges in a relatively shallow position (on the first surface side of the semiconductor substrate 300). On the other hand, in the P-type semiconductor regions 308 and 309, there are a region that indicates a local minimum value of the impurity concentration and a region that indicates a local minimum value of the potential with respect to signal charges in a relatively deep position (on the semiconductor region 304 side).

Because of this structure, the potentials of the solid-state image pickup device 100 according to the comparative example along the line E-F and along the line G-H are as shown in FIGS. 5B and 5C. In other words, at a position where the impurity concentrations of the semiconductor regions 306a and 306b are high and a potential with respect to signal charges is deep (at deep depth), a potential barrier with respect to signal charges in a region between the photoelectric conversion portions PD1 and PD2 is high. On the other hand, at a position where the impurity concentrations of the semiconductor regions 306a and 306b are low and a potential with respect to signal charges is shallow (at shallow depth), a potential barrier with respect to signal charges in a region between the photoelectric conversion portions PD1 and PD2 is low.

In the solid-state image pickup device 100 of the comparative example, in a region between the photoelectric conversion portions PD1 and PD2 or a region between the photoelectric conversion portions PD3 and PD4, there is a peak including the minimum value of the potential with respect to signal charges at a deep position in the semiconductor substrate 300 (on the semiconductor region 304 side). In the N-type semiconductor regions 306 and 307, there is a region where the potential with respect to signal charges is deep at a shallow position of the semiconductor substrate 300 (on the first surface side).

Therefore, signal charges generated particularly at a deep position in the semiconductor substrate 300 among signal charges generated in the photoelectric conversion portion PD1 or PD3 may move to the adjacent photoelectric conversion portion PD2 or PD4 through the semiconductor region 309 whose potential barrier is small. In other words, in the semiconductor regions 308 and 309 arranged between the photoelectric conversion portions PD1 and PD2, a region (here, the semiconductor region 309) where the potential with respect to signal charges reaches a peak including the minimum value becomes a leakage path. Here, a region between the photoelectric conversion portions PD1 and PD2 indicates a region from the first surface of the semiconductor substrate to a deepest portion of a PN junction formed by the semiconductor region 306a-2 and the semiconductor region 304 in the depth direction.

In the solid-state image pickup device 100 of the comparative example, the semiconductor region 309, which is a leakage path, is closer to the other region than to a region, where the potential with respect to signal charges indicates a peak including a local minimum value, in the photoelectric conversion portions PD1 and PD2. In other words, the semiconductor region 309, which is a leakage path, is arranged close to a region where the potential with respect to signal charges is relatively high in the photoelectric conversion portions PD1 and PD2.

In this case, signal charges generated by photoelectric conversion in the semiconductor region 306b-1 are collected by the semiconductor region 306a-1 whose potential is low, however, a part of the signal charges moves to the semiconductor region 306b-2 through the leakage path. Thereby, light entering the photoelectric conversion portion PD1 is accumulated in the photoelectric conversion portion PD2 before signal charges of the photoelectric conversion portion PD1 reach a saturation charge quantity, and isolation performance between the photoelectric conversion portions PD1 and PD2 degrades.

On the other hand, in the solid-state image pickup device of the present embodiment, the potential with respect to signal charges in the photoelectric conversion portions PD1 and PD2 is low, and the semiconductor region 309, which is a leakage path, is arranged close to the semiconductor region 306a-1 where the signal charges are collected.

In this case, the potential of the semiconductor region 306a-1 is lower than that of the semiconductor region 306a-2, so that a potential gradient from a position where the signal charges are generated to a region where the signal charges are collected is greater than a potential gradient from the position where the signal charges are generated to the leakage path. Therefore, in the solid-state image pickup device 100 of the present embodiment, a probability that the signal charges are collected by the semiconductor region 306a-1 is higher than in a configuration of the comparative example. In other words, a probability that the signal charges are collected by the semiconductor region 306a-1 is higher than a probability that the signal charges move to the semiconductor region 306b-1 through the leakage path. Therefore, the isolation performance of the photoelectric conversion portion PD1 and the photoelectric conversion portion PD2 can be improved as compared with the comparative example.

Here, the depth of the semiconductor substrate 300 where incident light into the solid-state image pickup device 100 is photoelectrically converted varies according to the wavelength of the light. Specifically, the relatively longer the wavelength of the light is, the more probably the light is photoelectrically converted at a deep position.

Therefore, when the semiconductor region 309, which is a leakage path as in the comparative example, is located at a deep position in the semiconductor substrate 300, signal charges of light of a long wavelength (light that is photoelectrically converted in a region close to the semiconductor region 309) may move to an adjacent photoelectric conversion portion. On the other hand, in the semiconductor region 306a, signal charges generated by photoelectric conversion in a region shallower than the depth where the semiconductor region 309 of the semiconductor substrate 300 is arranged are collected by the semiconductor region 306a-1. A probability that the signal charges generated in this region move to an adjacent photoelectric conversion portion through the semiconductor region 309 is low. Therefore, the probability that the signal charges move to an adjacent photoelectric conversion portion through the semiconductor region 309 varies according to the wavelength, that is, isolation performance between the photoelectric conversion portions varies according to the wavelength.

On the other hand, in the solid-state image pickup device 100 of the present embodiment, the potential with respect to signal charges in the photoelectric conversion portion is low, so that the semiconductor region 309, which is a leakage path, is arranged close to the semiconductor region 306a-1 where the signal charges are collected. Therefore, there is a high probability that, for example, the signal charges generated by the semiconductor region 306b-1 that is located at a deep position of the semiconductor substrate 300 do not move to the adjacent photoelectric conversion portion PD2 through the semiconductor region 309 and are collected by the semiconductor region 306a-1. Therefore, the probability that signal charges caused by light of a long wavelength (light that is photoelectrically converted at the same depth as the semiconductor region 306b-1) move to an adjacent photoelectric conversion portion is lower than that in the comparative example.

In the solid-state image pickup device 100 of the present embodiment, the potential with respect to the signal charges of the semiconductor region 306a-1 has a peak including the minimum value and is sufficiently lower than the potential with respect to the signal charges of the semiconductor region 309. Therefore, it is more probable that the signal charges caused by light of a short wavelength that is mainly photoelectrically converted in a shallow region (the semiconductor region 306a-1) of the semiconductor substrate 300 are collected by the semiconductor region 306a-1 than that the signal charges move to the photoelectric conversion portion PD2. Therefore, a probability that even signal charges caused by light of a short wavelength move to the adjacent photoelectric conversion portion PD2 is low. The signal charges generated in the photoelectric conversion portion PD1 exceed the saturation charge quantity, the charges generated in the photoelectric conversion portion PD1 move to the photoelectric conversion portion PD2 through the semiconductor region 309.

Therefore, by using the configuration of the present embodiment, it is possible to more improve the isolation performance between a plurality of photoelectric conversion portions (here, the photoelectric conversion portions PD1 and PD2 or the photoelectric conversion portions PD3 and PD4) with respect to a wavelength than the configuration of the comparative example. That is to say, it is possible to reduce dependence of a moving amount of signal charges between the photoelectric conversion portions with respect to the wavelength of the incident light. Therefore, even when reading or processing the signal charges generated in a plurality of photoelectric conversion portions, respectively, as individual signals, it is possible to obtain a sufficient isolation performance.

Figure 6A:
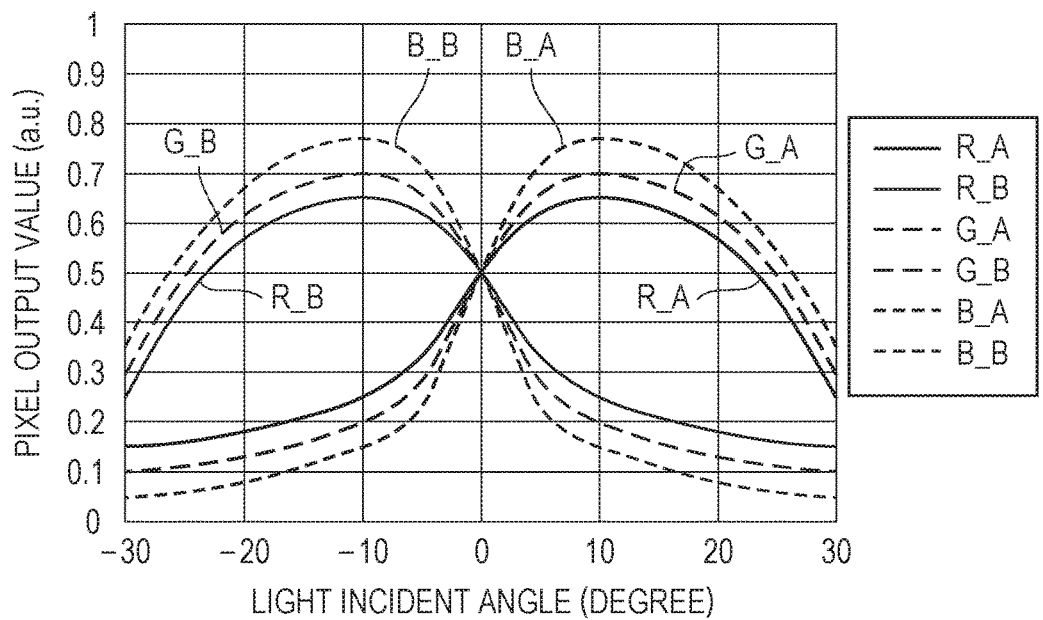
FIGS. 6A and 6B are diagrams showing an output signal with respect to an incident angle of light for each wavelength of a photoelectric conversion unit.
Figure 6B:
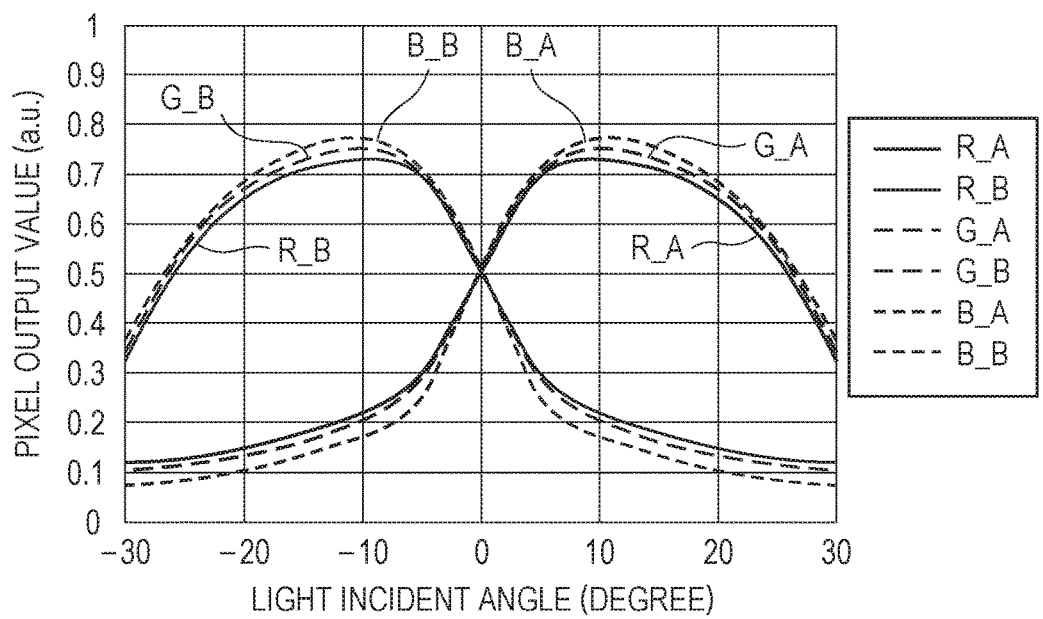

FIG. 6A shows incident angle dependence related to the photoelectric conversion portion of the comparative example. FIG. 6B shows incident angle dependence related to the photoelectric conversion portion of the present embodiment. The horizontal axis represents an incident angle of light. The vertical axis represents an output signal value from the photoelectric conversion portion. A state is shown where an experiment is performed by changing the wavelength of the incident light.

In FIGS. 6A and 6B, a solid line R_A represents an output signal value from the photoelectric conversion portion PD1 when red light of a wavelength of about 600 nm is made incident. A solid line R_B represents an output signal value from the photoelectric conversion portion PD2 when light of a similar wavelength is made incident. Similarly, a dashed line G_A and a dashed line G_B represent output signal values from the photoelectric conversion portions PD1 and PD2, respectively, when green light of a wavelength of about 550 nm is made incident. Further, a dashed line B_A and a dashed line B_B represent output signal values from the photoelectric conversion portions PD1 and PD2, respectively, when blue light of a wavelength of about 450 nm is made incident.

As shown in FIG. 6A, in the solid-state image pickup device 100 of the comparative example, a moving amount of charges to an adjacent photoelectric conversion portion when receiving red light is greater than when receiving green light or blue light, so that the solid-state image pickup device 100 has different characteristics depending on a wavelength of received light. In this way, the isolation performance between adjacent photoelectric conversion portions varies depending on the wavelength (color) of the light.

Therefore, for example, when an image pickup device having the solid-state image pickup device 100 of the comparative example picks up an image by using a taking lens having a large magnification chromatic aberration, an output signal varies for each color in a peripheral portion of the image pickup device. Therefore, a malfunction occurs in an autofocus performance and an image pickup signal.

On the other hand, as shown in FIG. 6B, when the solid-state image pickup device 100 of the present embodiment receives light of different wavelengths, output signals from the photoelectric conversion portion show similar distributions regardless of the wavelength of the light. Therefore, by using the configuration of the present embodiment, dependence of the isolation performance between adjacent photoelectric conversion portions with respect to the wavelength of light (color) is reduced as compared with the comparative example. Therefore, it is possible to improve the performances of the autofocus and the image pickup signal in the image pickup device having the solid-state image pickup device 100 of the present embodiment.

Therefore, the above effects can be obtained by employing the configuration described below. For example, a depth range from a position 0.5 μm shallower than a depth where the impurity concentration of the semiconductor region 306a-1 indicates a local maximum value in the depth direction of the semiconductor substrate 300 to a position 0.5 μm deeper than the depth is defined as a range Rcn. Further, a depth range from a position 0.5 μm shallower than a depth where the impurity concentration of the semiconductor region 309 indicates a local maximum value in the depth direction to a position 0.5 μm deeper than the depth is defined as a range Rcp. At this time, the depth range Rcn and the depth range Rcp at least partially overlap with each other.

Further, a depth range from a position 0.5 μm shallower than a depth where the potential with respect to the signal charges of the semiconductor region 309 indicates a local maximum value in the depth direction to a position 0.5 μm deeper than the depth is defined as a range Rpn. Further, a depth range from a position 0.5 μm shallower than a depth where the potential with respect to the signal charges of the semiconductor region 306a-1 indicates a local maximum value in the depth direction to a position 0.5 μm deeper than the depth is defined as a range Rpp. At this time, the range Rpn and the range Rpp at least partially overlap with each other in a direction perpendicular to the depth direction of the cross-section.

By configuring in this way, a region that functions as a leakage path for the signal charges of the photoelectric conversion portion PD1 can be arranged close to a region where the signal charges of the photoelectric conversion portion PD1 are collected.

A depth range that indicates a peak including the maximum value of the impurity concentration of the semiconductor region 306 and a depth range that indicates a peak including the maximum value of the impurity concentration of the semiconductor regions 308 and 309 may at least partially overlap with each other in the depth direction of the cross-section. Further, in the depth direction, a depth range where the potential with respect to the signal charges of the semiconductor region 306 indicates a peak including a local minimum value and a depth range where the potential with respect to the signal charges of the semiconductor regions 308 and 309 indicates a peak including a local minimum value may at least partially overlap with each other.

In the configurations shown in FIGS. 4A and 4F, for example, the configuration below may also be employed. A depth of a region where the impurity concentration of the semiconductor region 306 indicates a local maximum value is within a range from the first surface of the semiconductor substrate 300 to a depth of 1.2 μm. Further, a region where the impurity concentration of the semiconductor regions 308 and 309 indicates a local minimum value is within a range between a depth of 0.2 μm and a depth of 1.2 μm from the first surface.

Further, a depth of a region that indicates the minimum value of the potential with respect to the signal charges of the photoelectric conversion portion PD1 in the semiconductor region 306 is within a range from the first surface of the semiconductor substrate 300 to a depth of 1.0 μm. Further, a depth of a region that indicates the minimum value of the potential with respect to the signal charges in the semiconductor regions 308 and 309 is within a range between a depth of 0.2 μm and a depth of 1.0 μm from the first surface.

The solid-state image pickup device 100 has the configuration described above, so that the dependence of the isolation performance between adjacent photoelectric conversion portions with respect to the wavelength of light (color) is reduced as compared with the comparative example shown in FIGS. 5A to 5D. Therefore, it is possible to improve the performances of the autofocus and the image pickup signal in the image pickup device having the solid-state image pickup device 100 of the present embodiment.

Second Embodiment

Figure 7A:
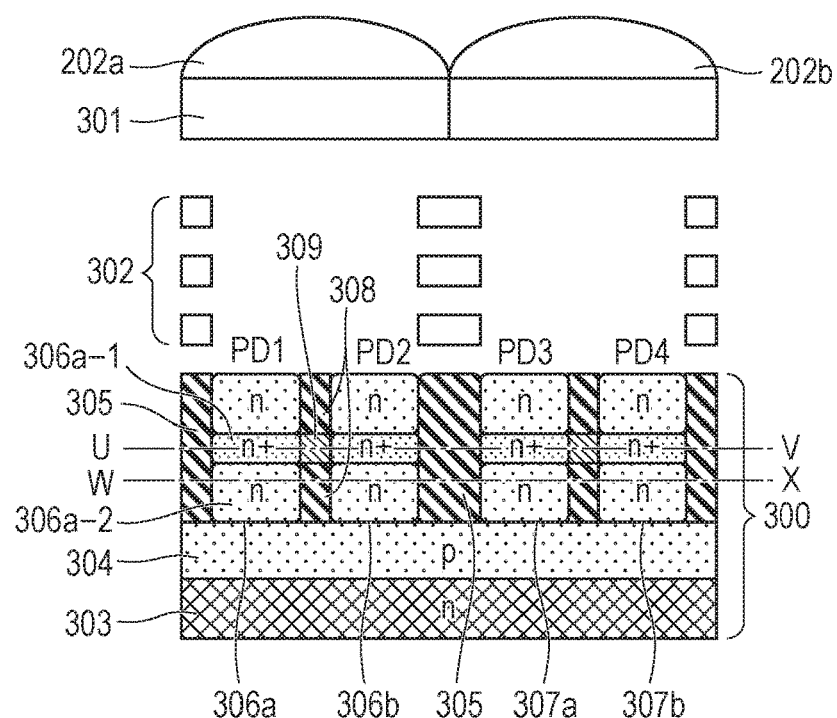
FIGS. 7A to 7C are diagrams schematically showing a cross-section of a part of a solid-state image pickup device.
Figure 7B:
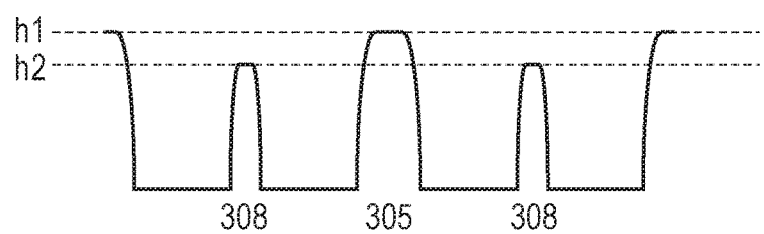
Figure 7C:
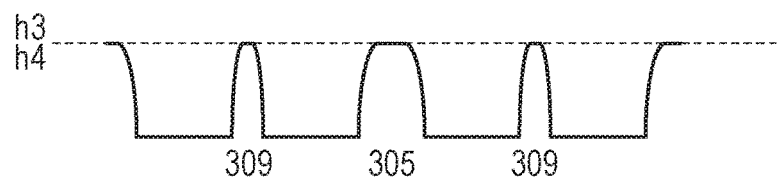

A second embodiment will be described with reference to FIGS. 7A to 7C. Description of portions that have the same configuration, function, and material as those of the first embodiment will be omitted.

The solid-state image pickup device 100 of the present embodiment is different from the solid-state image pickup device 100 of the first embodiment in the following points. In the solid-state image pickup device 100 of the present embodiment, in the N-type semiconductor regions of a plurality of photoelectric conversion portions included in one photoelectric conversion unit, distribution of the impurity concentration and the potential with respect to signal charges in the depth direction of the semiconductor substrate 300 varies. Further, in the P-type semiconductor regions that perform isolation between a plurality of photoelectric conversion portions included in one photoelectric conversion unit, distribution of the impurity concentration and the potential with respect to signal charges in the depth direction of the semiconductor substrate 300 varies.

For example, in the N-type semiconductor region 306, the semiconductor region 306a-1 whose impurity concentration is high is arranged at a middle depth of the semiconductor region 306. Specifically, as shown in FIG. 7A, the semiconductor region 306a-1 is arranged between the semiconductor regions 306a-2 whose impurity concentration is lower than that of the semiconductor region 306a-1 in the depth direction of the semiconductor substrate 300.

Thereby, a region where the potential with respect to signal charges is low in the semiconductor region 306 can be formed at a deep position of the semiconductor substrate 300 instead of on the first surface side of the semiconductor substrate 300. Therefore, the signal charges generated by photoelectric conversion are not accumulated in a surface layer on the first surface side of the semiconductor substrate 300, so that it is possible to reduce effects of a dark current in an output signal.

In a region between the photoelectric conversion portions PD1 and PD2, the semiconductor region 309 whose impurity concentration is low is arranged between the semiconductor regions 308 whose impurity concentration is higher than that of the semiconductor region 309 instead of on the first surface side of the semiconductor substrate 300. Further, a local minimum value in the depth direction of the impurity concentration of the semiconductor region 309 is within a depth range from a position 0.5 µm shallower than a depth where the impurity concentration of the N-type semiconductor region 306 indicates a local maximum value to a position 0.5 µm deeper than the depth. Further, a local minimum value in the depth direction of the potential with respect to the signal charges of the semiconductor region 309 is within a depth range from a position 0.5 µm shallower than a depth where the potential with respect to the signal charges of the semiconductor region 306 indicates a local maximum value to a position 0.5 µm deeper than the depth. In other words, a region that functions as a leakage path for the signal charges generated by the photoelectric conversion portion PD1 is arranged close to a region where the signal charges of the photoelectric conversion portion PD1 are accumulated.

Therefore, as described in the first embodiment, it is possible to reduce the difference of the isolation performance between the photoelectric conversion portions due to the wavelength of the incident light. In this way, it is possible to obtain a good isolation performance between the photoelectric conversion portions while reducing the effects of dark current.

Third Embodiment

Figure 8A:
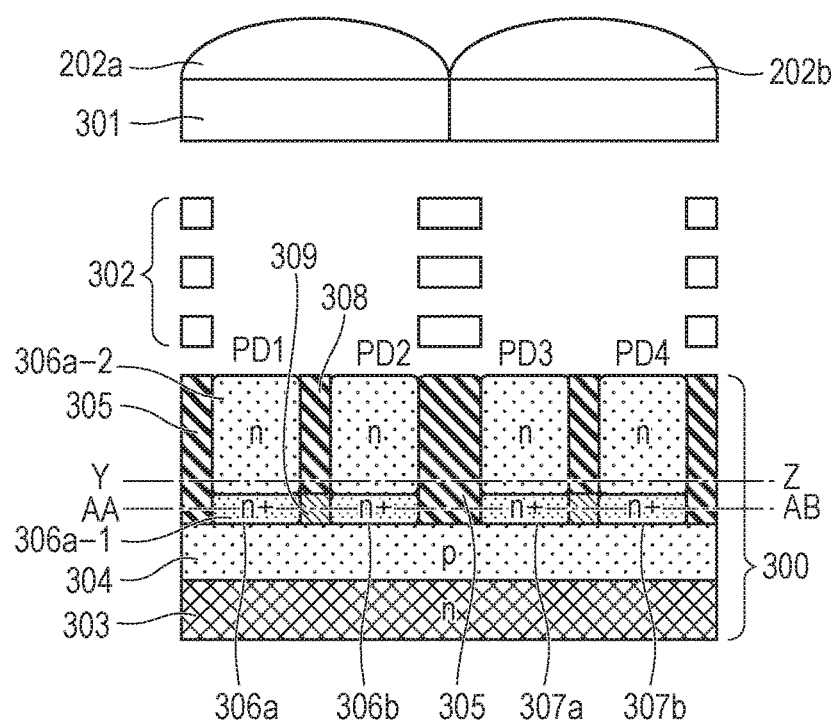
FIGS. 8A to 8C are diagrams schematically showing a cross-section of a part of a solid-state image pickup device.
Figure 8B:
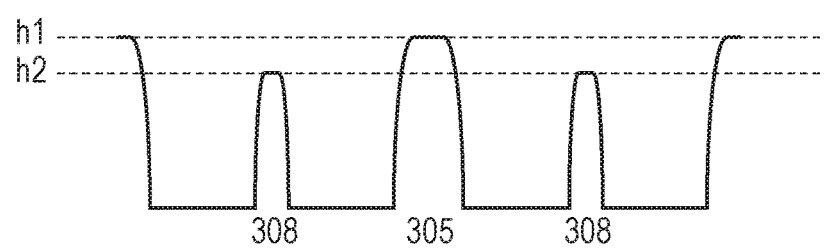
Figure 8C:
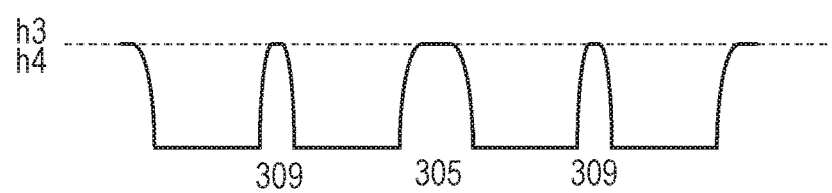

The present embodiment will be described with reference to FIGS. 8A to 8C. The description of the same portions as those in the first and the second embodiments will be omitted.

The solid-state image pickup device 100 of the present embodiment is different from the solid-state image pickup device 100 of the first and the second embodiments in the following points. In the solid-state image pickup device 100 of the present embodiment, in the N-type semiconductor regions of a plurality of photoelectric conversion portions included in one photoelectric conversion unit, distribution of the impurity concentration and the potential with respect to signal charges in the depth direction of the semiconductor substrate 300 varies. Further, in the P-type semiconductor regions that perform isolation between a plurality of photoelectric conversion portions included in one photoelectric conversion unit, distribution of the impurity concentration and the potential with respect to signal charges in the depth direction of the semiconductor substrate 300 varies.

Specifically, the semiconductor region 306a-1 that has a peak including a local maximum value of the impurity concentration in the N-type semiconductor region 306 is arranged at a deep position of the photoelectric conversion portion PD1 in the depth direction of the semiconductor substrate 300. As shown in FIG. 8A, the semiconductor region 306a-1 is arranged at a position deeper than the semiconductor region 306a-2 whose impurity concentration is lower than that of the semiconductor region 306a-1.

Thereby, in the semiconductor region 306 of the photoelectric conversion portion, a position where the potential with respect to signal charges is low is deeper than that in the configuration of the second embodiment. Therefore, the signal charges generated by photoelectric conversion are accumulated in a deep position so that it is possible to more efficiently accumulate signal charges caused by light having a relatively long wavelength, for example, light having a wavelength of 900 nm. In other words, it is possible to improve sensitivity of the photoelectric conversion portion with respect to light having a relatively long wavelength.

The semiconductor region 309 whose impurity concentration is low is not arranged on the first surface side of the semiconductor substrate 300 and is arranged at a position deeper than the semiconductor region 308 whose impurity concentration is higher than that of the semiconductor region 309. Further, regarding the depth of the position, in the same manner as in the first and the second embodiments, the region that functions as a leakage path for the signal charges generated by the photoelectric conversion portion is arranged close to a region where the signal charges of the photoelectric conversion portion are accumulated. Therefore, as described in the first and the second embodiments, it is possible to reduce the difference of the isolation performance between the photoelectric conversion portions due to the wavelength of the incident light.

In this way, it is possible to improve the isolation performance between the photoelectric conversion portions while improving the sensitivity to light having a long wavelength.

Fourth Embodiment

The present embodiment will be described with reference to FIGS. 9A and 9B. The description of the same portions as those in the first to the third embodiments will be omitted.

The solid-state image pickup device 100 of the present embodiment is a back surface irradiation type solid-state image pickup device where a multilayer wiring layer 302 of pixels is not arranged on a surface of the semiconductor substrate 300 where light enters but is arranged on the reverse side of the surface where light enters (light receiving surface).

Figure 9A:
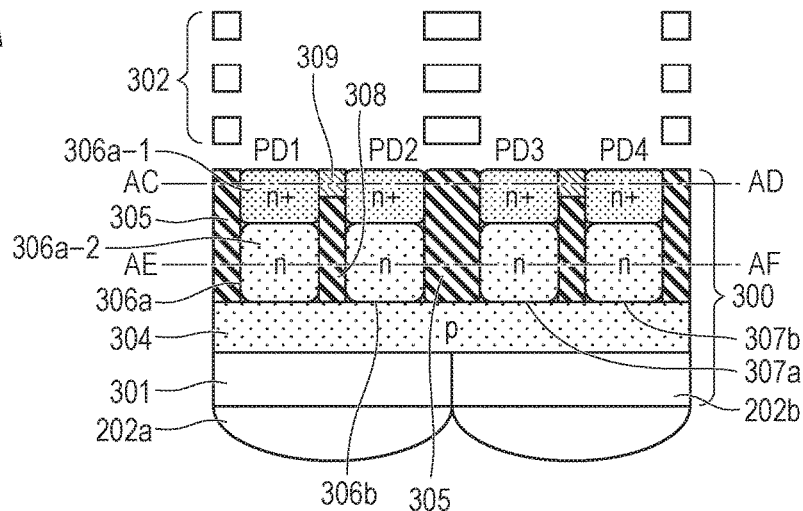
FIGS. 9A to 9D are diagrams schematically showing a cross-section of a part of a solid-state image pickup device.

The solid-state image pickup device 100 shown in FIG. 9A is different from those of the other embodiments in that the color filter 301 and the microlens 202 are not arranged on the first surface side (a side where the multilayer wiring layer 302 is arranged in FIG. 4A) of the semiconductor substrate 300 but are arranged on a second surface side. In other words, in the present embodiment, the light receiving surface is not the first surface of the semiconductor substrate 300 but the second surface.

Figure 9B:
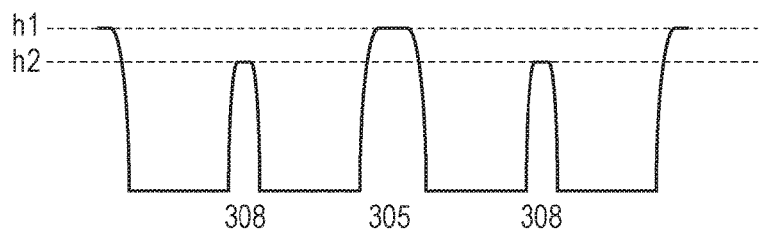
Figure 9C:
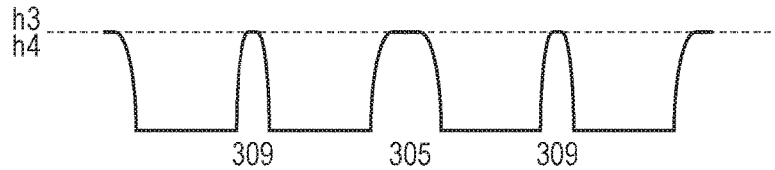
Figure 9D:
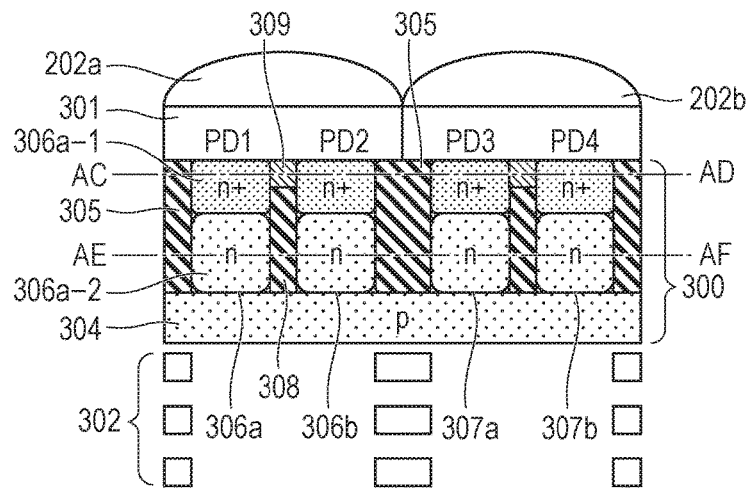

Further, the solid-state image pickup device 100 shown in FIG. 9B does not have the N-type semiconductor region 303 located at a position deeper than the P-type semiconductor region 304 in the semiconductor substrate 300. Further, the multilayer wiring layer 302 is not arranged on the first surface side (on a side where the microlens 202 is arranged in FIG. 4A) of the semiconductor substrate 300 but is arranged on the second surface side. The solid-state image pickup device 100 shown in FIG. 9B is different from those of the other embodiments in these points.

Even in either configuration of FIG. 9A or FIG. 9B, the multilayer wiring layer 302 is arranged on a surface opposite to the light receiving surface of the semiconductor substrate 300. By employing this configuration, light that enters a pixel from various angles efficiently reaches a photodiode without being reflected by the wiring layer 302. Therefore, it is possible to improve sensitivity of the solid-state image pickup device 100.

The distribution of the impurity concentration and the distribution of the potential with respect to signal charges in each semiconductor region are the same as those described in the first embodiment. Specifically, the semiconductor region 309 whose impurity concentration is lower than that of the semiconductor region 308 is arranged closer to the first surface side than the semiconductor region 308 in the semiconductor substrate 300.

Further, the N-type semiconductor regions 306a-1 and 306b-1 which are regions that collect signal charges are arranged closer to the first surface side of the semiconductor substrate 300 than the semiconductor regions 306a-2 and 306b-2 whose impurity concentration is lower than that of the N-type semiconductor regions 306a-1 and 306b-1. Similarly, N-type semiconductor regions 307a-1 and 307b-1 which are regions that collect signal charges are arranged closer to the first surface side of the semiconductor substrate 300 than semiconductor regions 307a-2 and 307b-2 whose impurity concentration is lower than that of the N-type semiconductor regions 307a-1 and 307b-1.

Further, in the same manner as in the first to the third embodiments, the region that functions as a leakage path for the signal charges generated by the photoelectric conversion portion is arranged close to a region where the signal charges of the photoelectric conversion portion are accumulated.

Therefore, as described in the first to the third embodiments, it is possible to reduce the difference of the isolation performance between the photoelectric conversion portions due to the wavelength of the incident light. In this way, it is possible to have a good sensitivity for light incident at various angles and improve the isolation performance between the photoelectric conversion portions.

Fifth Embodiment

In the present embodiment, a manufacturing method of the solid-state image pickup device 100 shown in FIG. 4A of the first embodiment will be described with reference to FIGS. 10A to 10D. Here, for simplicity, only a portion of one photoelectric conversion unit corresponding to one microlens 202a will be described. However, the other photoelectric conversion units are formed in the same manner. An example will be described where an N-type semiconductor substrate is used as the semiconductor substrate 300.

Figure 10A:
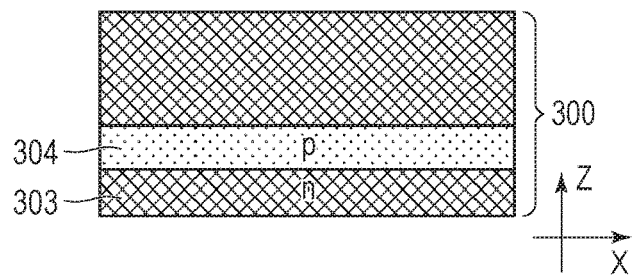
FIGS. 10A to 10D are diagrams for explaining a manufacturing method of a part of the solid-state image pickup device shown in FIGS. 4A to 4G.

In the N-type semiconductor substrate, as shown in FIG. 10A, boron (B), which is impurity that gives P-type, is injected into a region to be the P-type semiconductor region 304. The semiconductor region 304 forms a potential barrier that regulates a collection depth of signal charges of a photoelectronic conversion portion. By causing the semiconductor region 304 to have a sufficient impurity concentration with respect to the N-type semiconductor substrate and the N-type semiconductor region 306 that will be formed later, the semiconductor region 304 can be a potential barrier against generated signal charges. Thereby, in the N-type semiconductor substrate, a region deeper than the semiconductor region 304 becomes the N-type semiconductor region 303.

As an injection condition of boron, in one embodiment, a dosage of boron is from $1E11$ $cm^{-3}$ to $1E12$ $cm^{-3}$. However, the dose amount of boron can be appropriately changed according to the impurity concentration of the N-type semiconductor substrate and the impurity concentration of the semiconductor region 306. In the case of a solid-state image pickup device that photoelectrically converts light of a wavelength in the visible region, the semiconductor region 304 is often formed in a depth range of 3 μm to 5 μm from the surface of the semiconductor substrate. In this case, the acceleration voltage can be 3000 to 4000 keV.

When improving the sensitivity of the photoelectric conversion portion to light having a wavelength in a near infrared region, in one embodiment, the semiconductor region 304 is formed in a deeper position. For example, when improving the sensitivity to light having a wavelength of 900 nm, it is possible to form the semiconductor region 304 at a depth of 30 μm or more from the surface of the semiconductor substrate.

Next, the semiconductor region 305 and the semiconductor regions 308 and 308 are formed respectively by injecting an impurity that gives P-type into the semiconductor substrate by causing the impurity to pass through a region R1 and a region R2 on the surface of the semiconductor substrate. The P-type semiconductor region 305 functions as an isolation region between adjacent pixels (photoelectric conversion units). The semiconductor regions 308 and 309 respectively function as a region that separates signal charges between a plurality of photoelectric conversion portions included in one photoelectric conversion unit and a region that becomes a moving path of signal charges. The region R1 and the region R2 are regions that are defined on the surface of the semiconductor substrate to which the impurity is injected.

The semiconductor region 308 may be formed by injecting an impurity several times while changing conditions of the acceleration voltage and the concentration according to a depth of a charge collection region of the photoelectric conversion portion (a deepest portion of a PN junction formed by the semiconductor region 306 and the semiconductor region 304). Here, as impurity that gives P-type, boron is injected through the region R1. For example, when forming a photoelectric conversion portion where the depth of the charge collection region is about 3 μm, the injection is performed at 2000 to 3000 Kev as injection to a deepest region of the semiconductor region 308.

Figure 10B:
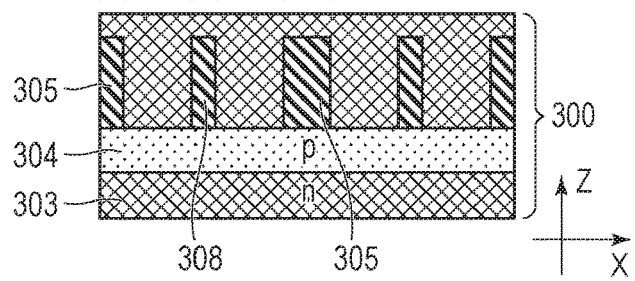

Thereafter, for example, impurity is injected for two to ten times in order to form an isolation region for signal charges to a depth immediately above a region to be the semiconductor region 309 (FIG. 10B). In this case, when a depth range where boron is injected is large, that is, when a difference between the acceleration voltages when injecting boron is large, a region where the concentration of boron is low is formed between regions adjacent in the depth direction, so that signal charges may leak through the region. Therefore, in one embodiment, the difference between the acceleration voltages when injecting boron and form a deep region to a shallow region is reduced so that all the regions have a uniform impurity concentration.

In a forming process of the semiconductor region 308, boron is injected through the region R2, so that a part of the semiconductor region 305, that is, a portion formed at the same depth as the semiconductor region 308, is formed at the same time.

Figure 10C:
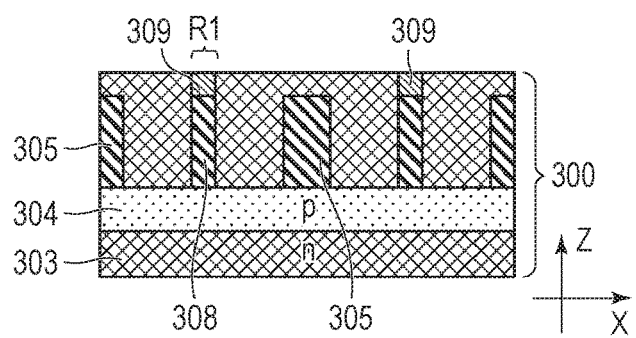

Next, as shown in FIG. 10C, the semiconductor region 309 is formed by injecting boron as an impurity that gives P-type through the region R1. The P-type semiconductor region 309 functions as a moving region of signal charges between a plurality of photoelectric conversion portions included in one photoelectric conversion unit, that is, a leakage path. Therefore, the concentration and the acceleration voltage when injecting boron for forming the semiconductor region 309 are set lower than the concentration and a preliminary acceleration voltage when injecting boron for forming the semiconductor region 308. Specifically, in one embodiment, the boron is injected at a concentration of about ½ to 1/10 of the concentration of the boron injected into the region 308.

The acceleration voltage can be, for example, about 50 keV to 200 keV considering the depth of the region where the semiconductor region 309 is formed. When forming the semiconductor region 309, the injection can be performed in several times. It is possible to perform more detailed potential design.

Although not shown in the drawings, after the semiconductor region 309 is formed, impurity, for example, boron, which gives P-type to the semiconductor substrate, is injected onto the partially formed P-type semiconductor region 305 through a region (region R2) overlapping the partially formed P-type semiconductor region 305 in plan view. At this time, injection of the impurity which gives P-type, for example, arsenic, can be performed, for example, at the same acceleration voltage as that used when the semiconductor region 309 is formed. Thereby, the semiconductor region 305 shown in FIG. 4A is formed.

After the semiconductor region 309 is formed, the semiconductor regions 306a and 306b can be formed by injecting an impurity that gives N-type through regions R3 and R4 of the semiconductor substrate 300. The N-type semiconductor regions 306a and 306b function as regions that generate, collect, and accumulate signal charges of the photoelectric conversion portion.

A more detailed potential design can be performed on the semiconductor regions 306a and 306b by injecting an impurity giving N-type in several times in the depth direction of the semiconductor substrate. In the present embodiment, an example will be described where the semiconductor regions 306a and 306b are formed by injecting an impurity giving N-type in twice.

In the present embodiment, in the same manner as in FIG. 4A, the semiconductor region 309, which is a leakage path, is formed in a relatively shallow region, so that a concentration difference is made so that charges are accumulated in a relatively shallow region in the photoelectric conversion portion. First, arsenic (As) that gives N-type is injected at low concentration into a region at a certain depth in the semiconductor substrate through the region R3 and the region R4. Next, arsenic is injected at a higher concentration into a region shallower than the region doped with the arsenic of low concentration, through the region R3 and the region R4.

By performing first injection of arsenic at the acceleration voltage of about 400 to 500 KeV and the concentration of 1E12 cm$^{-3}$ to 10E12 cm$^{-3}$, it is possible to form the semiconductor region 306 having a thickness of about 3 μm in the depth direction. In one embodiment, the acceleration voltage and the concentration are appropriately changed when injecting arsenic according to the wavelength of light to be used.

When performing second injection of arsenic, a concentration higher than the concentration at the first injection and an acceleration voltage lower than the acceleration voltage at the first injection can be used. Thereby, it is possible to form a region where arsenic is injected at a higher concentration in a region shallower than the semiconductor region formed at the first injection of arsenic in the semiconductor substrate.

When performing second injection of arsenic, the acceleration voltage can be about 50 to 300 KeV. However, the second injection of arsenic is not limited to this, but a region where arsenic is injected may be formed on a side, where impurity of the photoelectric conversion portion is doped, in a region deeper than a region where the concentration of arsenic is low in the depth direction of the semiconductor substrate. A region where signal charges are accumulated is formed by the second injection of arsenic. For example, the concentration of the second injection of arsenic can be 1.2E12 cm$^{-3}$ to 20E12 cm$^{-3}$.

A concentration ration between first impurity injection for giving N-type and second impurity injection for giving N-type can be arbitrarily set. However, impurity is injected by the second injection by increasing the concentration ratio. The potential with respect to signal charges in relatively shallow region can be deep. Therefore, much more signal charges can be stored. On the other hand, when the potential with respect to the signal charges is too large, the signal charges may not be sufficiently transferred to a read circuit. Therefore, the concentration of the impurity (here, arsenic) that gives N-type for the second time is set by considering the above conditions.

Thereafter, a gate insulating layer, a gate electrode layer, and the like, which are not shown in the drawings, are formed, and impurity injection for giving N-type for forming a floating diffusion portion is performed. Thereafter, the multilayer wiring layer 302 shown in FIG. 4A is formed by repeating formation of an insulating layer and formation of a conductive layer, and the color filter 301 and the microlens 202 are formed.

Figure 10D:
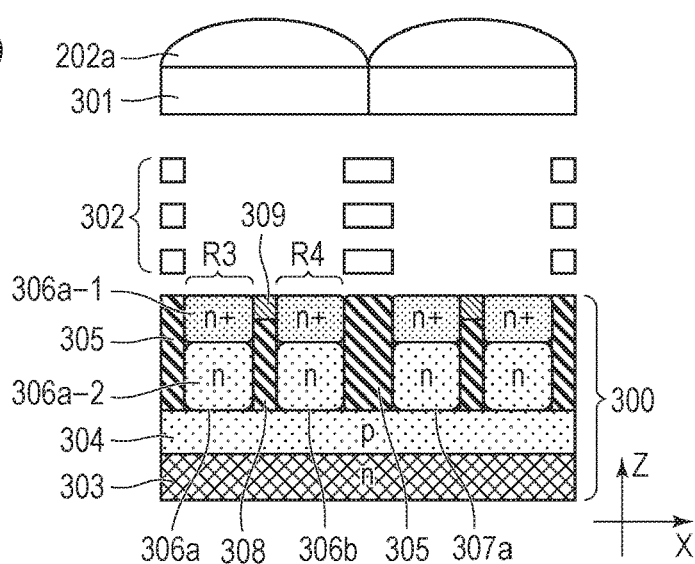

In these processes, the semiconductor substrate may be heated. By this heat treatment, the impurity injected into the semiconductor substrate is diffused, so that the concentration and the acceleration voltage when the impurity is injected are set by considering the diffusion, an angle of the injection, and the like. In this way, the semiconductor regions 306a-1, 306a-2, 306b-1, 306b-2, 305, 308, and 309 are formed (FIG. 10D).

As shown in FIG. 4F, when further arranging the P-type semiconductor region 311 into a shallowest portion of the semiconductor substrate, for example, an impurity that gives N-type is injected into the semiconductor substrate, and thereafter an impurity that gives the second conductivity type is injected. For example, after a floating diffusion portion not shown in the drawings is formed, boron is injected at a concentration higher than the concentration of boron injected into regions to be the semiconductor regions 308 and 309 and at an acceleration voltage lower than the acceleration voltage of boron injected into regions to be the semiconductor regions 308 and 309. Specifically, the boron is injected at the acceleration voltage of 9 keV and the concentration of 4E13 cm$^{-3}$ through at least a part of a second region and a third region. By arranging the semiconductor region 311, it is possible to suppress generation of dark current on the surface of the semiconductor substrate 300 and further improve characteristics of the photoelectric conversion portion.

In the present embodiment, an example is shown where the injection of impurity that gives P-type for forming the semiconductor regions 308 and 309 is performed before the injection of impurity that gives N-type for forming the semiconductor regions 306 and 307. However, the order of the injection may be reversed. For example, after the impurity that gives N-type is injected into the semiconductor substrate through the regions R3 and R4 of the semiconductor substrate, the impurity that gives P-type may be injected into the semiconductor substrate through the regions R1 and R2.

Sixth Embodiment

The solid-state image pickup device 100 described in the first to the fourth embodiments can be used for an image pickup device or a device that performs focus detection on an image pickup surface. In the present embodiment, an example will be described where an image pickup device having the solid-state image pickup device 100 described in one of the first to the fourth embodiments performs focus detection during image pickup by phase difference detection on an image pickup surface.

The example will be described with reference to FIGS. 1, 11, 12A, and 12B. FIG. 11 is a conceptual diagram showing a situation where a light beam emitted from an exit pupil of a taking lens 900 enters the solid-state image pickup device 100. The microlens 202 and the color filter 301 are provided corresponding to the photoelectric conversion portions PD1 and PD2. The photoelectric conversion portions PD1 and PD2 are a plurality of photoelectric conversion portions which light collected by one microlens enters. Here, the center of the light beam emitted from the exit pupil 902 of the taking lens to a photoelectric conversion unit having the microlens 202 is defined as an optical axis 903.

The light emitted from the exit pupil 902 enters the solid-state image pickup device 100 with the optical axis 903 as the center. Light rays on the outermost circumference of light passing through a partial region 904 of the exit pupil 902 are indicated by a light beam 906 and a light beam 907. Further, light rays on the outermost circumference of light passing through a partial region 905 of the exit pupil 902 are indicated by a light beam 908 and a light beam 909. As known from FIG. 11, among the light beams emitted from the exit pupil 902, the light beams above the optical axis 903 enters the PD1 and the light beams below the optical axis 903 enters the PD2. In other words, the photoelectric conversion portions PD1 and PD2 respectively receive lights from different regions of the exit pupil 902 of the taking lens.

The phase difference is detected by utilizing these characteristics. In a region within a pixel, when viewing an image pickup region from above, data obtained from one photoelectric conversion portion of a plurality of photoelectric conversion portions which light collected by one microlens 202 enters is defined as a first line and data obtained from the other photoelectric conversion portion is defined as a second line. The phase can be detected by obtaining correlation data between the lines.

For example, in FIG. 11, data of the upper photoelectric conversion portion of the photoelectric conversion portions which light collected by one microlens enters is defined as the first line, and data of the lower photoelectric conversion portion is defined as the second line. In this case, the photoelectric conversion portion PD1 outputs one pixel data of the first line data, and photoelectric conversion portion PD2 outputs one pixel data of the second line data.

Figure 12A:
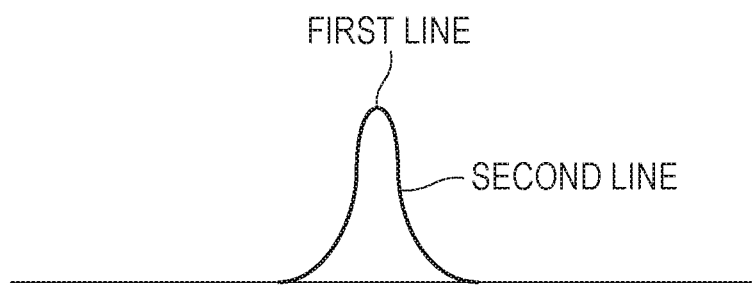
FIGS. 12A and 12B are diagrams schematically showing focus detection of a phase difference system.
Figure 12B:
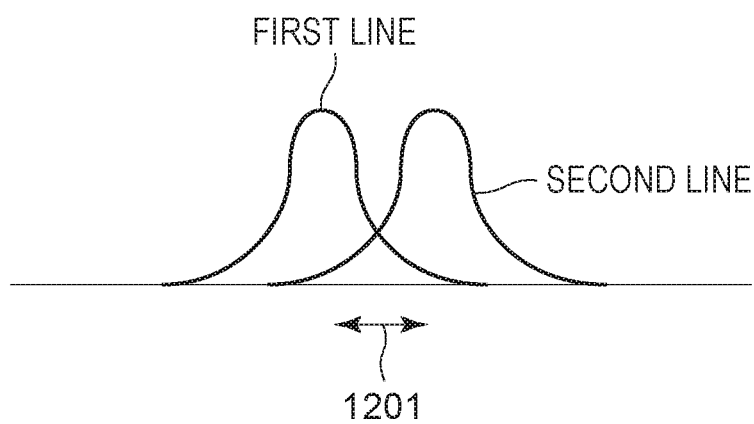

FIGS. 12A and 12B show line data when point source is imaged. FIG. 12A is data of the first line and the second line in a state of being focused. The horizontal line represents a pixel position, and the vertical axis represents an output. When being focused, the first line and the second line are overlapped with each other. FIG. 12B is line data in a state of being defocused. In this case, there is a phase difference between the first line and the second line, and pixels positions are shifted from each other. When calculating a misalignment amount 1201 described above, a shift amount between a focused state and a defocused state is known. It is possible to perform focusing by detecting the phases in this way and driving a lens.

Next, generation of image data in these pixel arrangements will be described. As described above, a focal point can be detected by performing a calculation to detect a phase difference by using signals corresponding to outputs of the photoelectric conversion portions PD1 and PD2 of the solid-state image pickup device 100. Further, it is possible to generate data corresponding to a picked-up image by processing a signal obtained by adding outputs of the photoelectric conversion portions which light collected by one microlens 202 enters. For example, in the signal processing unit 1007 in FIG. 1, the focal point can be detected by detecting a phase difference from an output of the photoelectric conversion portion PD1 which is read from the solid-state image pickup device 100. Further, it is possible to generate a signal corresponding to a picked-up image by processing a signal where signals from the photoelectric conversion portions PD1 and PD2 are added in the signal processing unit 1007.

Here, the addition of the outputs of the photoelectric conversion portions PD1 and PD2 may be performed in the solid-state image pickup device 100, and a signal after the addition may be outputted to the signal processing unit 1007. For example, when the floating diffusion portion is shared between a plurality of photoelectric conversion portions, it is possible to obtain a signal obtained by adding outputs of the plurality of photoelectric conversion portions. Further, the addition of the outputs of the photoelectric conversion portions PD1 and PD2 may be performed in the signal processing unit 1007. For example, the outputs of the photoelectric conversion portions PD1 and PD2 may be individually outputted to the signal processing unit 1007 and the outputs may be added in the signal processing unit 1007.

Therefore, the image pickup device can detect a focal point by using individual outputs of the photoelectric conversion portions based on the light passing through the microlens 202 and perform image pick-up by using an addition of outputs of a plurality of photoelectric conversion portions from the light passing through the microlens 202.

However, in a state where one photoelectric conversion portion is saturated, a signal of the photoelectric conversion portion is different from an output obtained by each photoelectric conversion portion by itself. Therefore, it may be determined that the reliability of the signal of the photoelectric conversion portion is low. In this case, phase detection is not performed. Alternatively, it is possible to employ a sequence to stop the phase detection. In other words, it is possible to perform an operation by determining whether or not to perform phase difference detection on an image surface of the image pickup device according to the signal of the photoelectric conversion portion or charges that can be accumulated.

By the way, while a pixel near the center of an image pickup element is described in FIG. 11, there is actually a large difference between incident light quantities of the photoelectric conversion portions of a pixel in a peripheral portion of the image pickup element. Therefore, it is possible to improve accuracy of focus detection by arranging a pixel for focus detection at an end portion rather than the center of the image pickup region.

As described above, the solid-state image pickup devices of the first to the fourth embodiments have a remarkable effect in the image pickup device in which outputs from a plurality of photoelectric conversion portions that receive light collected by one microlens are individually processed and/or added and processed.

By employing a configuration described in one of the first to the fourth embodiments, it is possible to obtain a sufficient isolation performance between the photoelectric conversion portions when individually processing the signals of the photoelectric conversion portions. On the other hand, when adding and processing the outputs of the photoelectric conversion portions, if signal charges exceed the saturation charge quantity in one photoelectric conversion portion, the signal charges begin to leak to a photoelectric conversion portion in the same photoelectric conversion unit before the signal charges begin to leak to another photoelectric conversion unit. Therefore, it is possible to suppress degradation of accuracy when adding and using the outputs of the photoelectric conversion portions in one photoelectric conversion unit. It is possible to perform more accurate processing by reducing the difference of isolation performance between the photoelectric conversion portions with respect to the wavelength of light in the solid-state image pickup device and the image pickup device as described above. For example, when performing the focus detection shown in FIGS. 11, 12A, and 12B, the difference of isolation performance between the photoelectric conversion portions by the wavelength of light can be reduced, so that the amount of difference between focus detection results for each color can be reduced. Therefore, it is possible to more accurately detect the focal point.

The solid-state image pickup device 100 and the image pickup device are not limited to devices that perform both focus detection and image pick-up by using outputs from a plurality of photoelectric conversion portions corresponding to one microlens. A solid-state image pickup device and an image pickup device which can individually process or add and process outputs from a plurality of photoelectric conversion portions corresponding to one microlens can obtain the effects described above. For example, when a plurality of photoelectric conversion portions are provided corresponding to one microlens to improve a dynamic range, it is possible to reduce the difference of isolation performance depending on the wavelength of light, so that variation between pixels can be reduced.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-145586, filed Jul. 27, 2017, which is hereby incorporated by reference herein in its entirety.

What is claimed is:

1. A solid-state image pickup device, comprising:
a semiconductor substrate including
a first photoelectric conversion portion having a first semiconductor region of a first conductivity type that collects signal charges,
a second photoelectric conversion portion having a second semiconductor region of the first conductivity type that collects signal charges, and
a third semiconductor region of a second conductivity type different from the first conductivity type,
wherein the third semiconductor region is arranged between the first semiconductor region and the second semiconductor region in plan view with respect to a first surface of the semiconductor substrate, and
an impurity concentration of the third semiconductor region has a local minimum value and an impurity concentration of the first semiconductor region has a local maximum value in a depth direction from the first surface to a second surface opposite to the first surface, and a depth range from a position 0.5 µm shallower than a position indicating the local minimum value to a position 0.5 µm deeper than the position indicating the local minimum value and a depth range from a position 0.5 µm shallower than a position indicating the local maximum value to a position 0.5 µm deeper than the position indicating the local maximum value are overlapped with each other.

2. A solid-state image pickup device, comprising:
a semiconductor substrate including
a first photoelectric conversion portion having a first semiconductor region of a first conductivity type that collects signal charges,
a second photoelectric conversion portion having a second semiconductor region of the first conductivity type that collects signal charges, and
a third semiconductor region of a second conductivity type different from the first conductivity type,
wherein the third semiconductor region is arranged between the first semiconductor region and the second semiconductor region in plan view with respect to a first surface of the semiconductor substrate,
in a depth direction from the first surface to a second surface opposite to the first surface, potential of the third semiconductor region with respect to the signal charges of the first photoelectric conversion portion has a first local minimum value and potential of the third semiconductor region with respect to the signal charges has a second local minimum value, and
a depth range from a position 0.5 µm shallower than a position indicating the first local minimum value to a position 0.5 µm deeper than the position indicating the first local minimum value and a depth range from a position 0.5 µm shallower than a position indicating the second local minimum value to a position 0.5 µm deeper than the position indicating the second local minimum value are overlapped with each other.

3. A solid-state image pickup device, comprising:
a semiconductor substrate including
a first photoelectric conversion portion having a first semiconductor region of a first conductivity type that collects signal charges,
a second photoelectric conversion portion having a second semiconductor region of the first conductivity type that collects signal charges, and
a third semiconductor region of a second conductivity type different from the first conductivity type,
wherein the third semiconductor region is arranged between the first semiconductor region and the second semiconductor region in plan view with respect to a first surface of the semiconductor substrate,
a depth of a region where an impurity concentration of the first semiconductor region indicates a local maximum value is within a range from the first surface of the semiconductor substrate to a depth of 1.2 µm, and a local minimum value of an impurity concentration of the third semiconductor region is within a range between a depth of 0.2 µm and a depth of 1.2 µm from the first surface.

4. A solid-state image pickup device, comprising:
a semiconductor substrate including
a first photoelectric conversion portion having a first semiconductor region of a first conductivity type that collects signal charges,
a second photoelectric conversion portion having a second semiconductor region of the first conductivity type that collects signal charges, and
a third semiconductor region of a second conductivity type different from the first conductivity type,
wherein the third semiconductor region is arranged between the first semiconductor region and the second semiconductor region in plan view with respect to a first surface of the semiconductor substrate,
a depth of a region indicating a local minimum value of potential with respect to the signal charges of the first photoelectric conversion portion in the first semiconductor region is within a range between the first surface and a depth of 1.0 µm of the semiconductor substrate, and
a depth of a region indicating a local minimum value of potential with respect to the signal charges in the third semiconductor region is within a range between a depth of 0.2 µm and a depth of 1.0 µm from the first surface.

5. The solid-state image pickup device according to claim 1, wherein the semiconductor substrate and microlenses are arranged so that the first photoelectric conversion portion and the second photoelectric conversion portion receive light passing through one microlens.

6. The solid-state image pickup device according to claim 5, wherein the microlenses are arranged on a first surface side of the semiconductor substrate.

7. The solid-state image pickup device according to claim 5, wherein the microlenses are arranged on a second surface side of the semiconductor substrate.

8. The solid-state image pickup device according to claim 1, further comprising: a fifth semiconductor region of a second conductivity type located between the first semiconductor region and the first surface of the semiconductor substrate in the depth direction of a cross-section including the first semiconductor region, the second semiconductor region, and the third semiconductor region.

9. The solid-state image pickup device according to claim 1, further comprising: a multilayer wiring layer arranged on the first surface side of the semiconductor substrate.

10. The solid-state image pickup device according to claim 1, further comprising: a multilayer wiring layer arranged on the second surface side of the semiconductor substrate.

11. An image pickup device comprising:
the solid-state image pickup device according to claim 5; and
a signal processing unit configured to perform focus detection by using an output of the first photoelectric conversion portion based on light passing through the microlens and perform image pickup by using addition of outputs of the first photoelectric conversion portion and the second photoelectric conversion portion based on light passing through the microlens.

12. An image pickup device comprising:
the solid-state image pickup device according to claim 1; and
a signal processing unit configured to generate a signal corresponding to a picked-up image based on an output from the solid-state image pickup device.

13. A manufacturing method of a solid-state image pickup device including a first photoelectric conversion portion having a first semiconductor region of a first conductivity type, a second photoelectric conversion portion having a second semiconductor region of the first conductivity type, and a third semiconductor region of a second conductivity type different from the first conductivity type which is arranged between the first semiconductor region and the second semiconductor region, the manufacturing method comprising:
injecting an impurity that gives the second conductivity type at a first concentration and a first acceleration voltage into a semiconductor substrate having the first conductivity type by causing the impurity to pass through a first region of a surface of the semiconductor substrate;
injecting an impurity that gives the second conductivity type at a second concentration lower than the first concentration and at a second acceleration voltage lower than the first acceleration voltage into the semiconductor substrate through the first region; and
injecting an impurity that gives the first conductivity type at a third concentration and a third acceleration voltage into the semiconductor by causing the impurity to pass through a second region and a third region, which are different from the first region, on the surface of the semiconductor substrate,
wherein the first region is located between the second region and the third region.

14. The manufacturing method of a solid-state image pickup device according to claim 13, wherein after injecting an impurity that gives the second conductivity type at the first concentration and the first acceleration voltage into the semiconductor substrate and injecting an impurity that gives the second conductivity type at the second concentration and the second acceleration voltage into the semiconductor substrate, an impurity that gives the first conductivity type at the third concentration and the third acceleration voltage is injected into the semiconductor.

15. The manufacturing method of a solid-state image pickup device according to claim 13, wherein after injecting an impurity that gives the first conductivity type at the third concentration and the third acceleration voltage into the semiconductor, heat treatment is performed on the solid-state image pickup device.

16. The manufacturing method of a solid-state image pickup device according to claim 13, wherein an impurity that gives the first conductivity type at a fourth concentration higher than the third concentration and at a fourth acceleration voltage lower than the third acceleration voltage is injected into the semiconductor by causing the impurity to pass through the second region and the third region.

17. The manufacturing method of a solid-state image pickup device according to claim 13, wherein
an impurity that gives the second conductivity type is injected into the semiconductor substrate by causing the impurity to pass through at least a part of the second region and the third region at a fifth concentration and a fifth acceleration voltage, and
the fifth concentration is higher than the first and the second concentrations and the fifth acceleration voltage is lower than the first acceleration voltage and the second acceleration voltage.

18. The solid-state image pickup device according to claim 3, wherein the semiconductor substrate and microlenses are arranged so that the first photoelectric conversion portion and the second photoelectric conversion portion receive light passing through one microlens.

19. The solid-state image pickup device according to claim 18, wherein the microlenses are arranged on a first surface side of the semiconductor substrate.

20. The solid-state image pickup device according to claim 18, wherein the microlenses are arranged on a second surface side of the semiconductor substrate.

21. The solid-state image pickup device according to claim 3, further comprising: a fifth semiconductor region of a second conductivity type located between the first semiconductor region and the first surface of the semiconductor substrate in the depth direction of a cross-section including the first semiconductor region, the second semiconductor region, and the third semiconductor region.

22. The solid-state image pickup device according to claim 3, further comprising: a multilayer wiring layer arranged on the first surface side of the semiconductor substrate.

23. The solid-state image pickup device according to claim 3, further comprising: a multilayer wiring layer arranged on the second surface side of the semiconductor substrate.

* * * * *